United States Patent
Jang et al.

(10) Patent No.: US 10,944,506 B2
(45) Date of Patent: Mar. 9, 2021

(54) METHOD AND APPARATUS FOR TRANSMITTING AND RECEIVING SIGNAL BY USING POLAR CODING

(71) Applicant: Samsung Electronics Co., Ltd, Suwon-si (KR)

(72) Inventors: Min Jang, Seongnam-si (KR); Kyungjoong Kim, Suwon-si (KR); Jaeyoel Kim, Seongnam-si (KR); Seho Myung, Seoul (KR); Seokki Ahn, Suwon-si (KR); Hongsil Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 31 days.

(21) Appl. No.: 16/483,732

(22) PCT Filed: Feb. 2, 2018

(86) PCT No.: PCT/KR2018/001440
§ 371 (c)(1),
(2) Date: Aug. 5, 2019

(87) PCT Pub. No.: WO2018/143717
PCT Pub. Date: Aug. 9, 2018

(65) Prior Publication Data
US 2020/0028615 A1 Jan. 23, 2020

(30) Foreign Application Priority Data
Feb. 3, 2017 (KR) .................. 10-2017-0015842

(51) Int. Cl.
*H04L 1/00* (2006.01)
*H03M 13/15* (2006.01)
(Continued)

(52) U.S. Cl.
CPC .......... *H04L 1/0042* (2013.01); *H03M 13/13* (2013.01); *H03M 13/155* (2013.01);
(Continued)

(58) Field of Classification Search
None
See application file for complete search history.

(56) References Cited

U.S. PATENT DOCUMENTS

2016/0013810 A1 1/2016 Gross et al.
2016/0164629 A1 6/2016 Ahn et al.
(Continued)

OTHER PUBLICATIONS

L. Chandesris, V. Savin and D. Declercq, "On puncturing strategies for polar codes," 2017 IEEE International Conference on Communications Workshops (ICC Workshops), Paris, 2017, pp. 766-771. (Year: 2017).*

(Continued)

*Primary Examiner* — Cynthia Britt

(57) ABSTRACT

Disclosed are: a communication method for merging, with IoT technology, a 5G communication system for supporting a data transmission rate higher than that of a 4G system; and a system thereof. The present disclosure can be applied to intelligent services (for example, smart home, smart building, smart city, smart car or connected car, healthcare, digital education, retail, security and safety related services, and the like) on the basis of a 5G communication technology and an IoT-related technology. A method by which a transmitter in a communication system transmits signals, according to one embodiment of the present specification, comprises the steps of: determining depth information for generating a mother code size and a parity bit; applying a polar code sequence corresponding to an information bit; generating, on the basis of the mother code size and the depth information, a codeword including a parity bit associated with at least two (Continued)

bits among a plurality of bits to which the polar code sequence is applied; and transmitting the generated codeword.

15 Claims, 26 Drawing Sheets

(51) Int. Cl.
  *H03M 13/00* (2006.01)
  *H03M 13/13* (2006.01)
(52) U.S. Cl.
  CPC ..... *H03M 13/618* (2013.01); *H03M 13/6356* (2013.01); *H03M 13/6362* (2013.01); *H04L 1/00* (2013.01); *H04L 1/0025* (2013.01); *H04L 1/0041* (2013.01); *H04L 1/0057* (2013.01); *H04L 1/0063* (2013.01); *H04L 1/0067* (2013.01); *H04L 1/0068* (2013.01); *H04L 1/0071* (2013.01)

(56) References Cited

U.S. PATENT DOCUMENTS

| | | | | |
|---|---|---|---|---|
| 2016/0241355 | A1* | 8/2016 | Mahdavifar | ........ H03M 13/033 |
| 2016/0248547 | A1 | 8/2016 | Shen et al. | |
| 2019/0393897 | A1* | 12/2019 | Gresset | ............... H03M 13/353 |

OTHER PUBLICATIONS

International Search Report and Written Opinion regarding International Application No. PCT/KR2018/001440, dated May 14, 2018, 17 pages.

Huawei et al., "Details of the Polar code design", 3GPP TSG RAN WG1 Meeting #87, R1-1611254, Nov. 2016, 15 pages.

Ericsson, "Consideration of Implementation Aspects of Polar Codes", 3GPP TSG RAN WG1 Meeting #87, R1-1611318, Nov. 2016, 6 pages.

Sarkis et al., "Flexible and Low-Complexity Encoding and Decoding of Systematic Polar Codes", arXiv:1507.03614v3 [cs.IT], Feb. 23, 2016, 13 pages.

Arikan, "Channel Polarization: A Method for Constructing Capacity-Achieving Codes for Symmetric Binary-Input Memoryless Channels", IEEE Transactions on Information Theory, vol. 55, No. 7, Jul. 2009, pp. 3051-3073.

Niu et al., "Beyond Turbo Codes: Rate-Compatible Punctured Polar Codes", 2013 IEEE International Conference on Communications (ICC)—Communications Theory, Jun. 2013, pp. 3423-3427.

Wang et al., "A Novel Puncturing Scheme for Polar Codes", IEEE Communications Letters, vol. 18, No. 12, Dec. 2014, pp. 2081-2084.

Leroux et al., "Hardware Implementation of Successive-Cancellation Decoders for Polar Codes", Journal of Signal Processing Systems, vol. 69, No. 3, Dec. 2012, pp. 305-315.

* cited by examiner

FIG. 24

| Clock | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|
| Stage 1 | f | $g^1$ | | | | | | | | g | | | | | | | |
| Stage 2 | | | f | $g^1$ | | | g | | | | f | $g^1$ | | | g | | |
| Stage 3 | | | | | f | g | | f | g | | | | f | g | | f | g |
| Output | | | | | $u_0$ | $u_1$ | | $u_2$ | $u_3$ | | | | $u_4$ | $u_5$ | | $u_6$ | $u_7$ |

2400

METHOD AND APPARATUS FOR TRANSMITTING AND RECEIVING SIGNAL BY USING POLAR CODING

CROSS-REFERENCE TO RELATED APPLICATIONS

This application is a 371 of International Application No. PCT/KR2018/001440 filed on Feb. 2, 2018, which claims priority to Korean Patent Application No. 10-2017-0015842 filed on Feb. 3, 2017, the disclosures of which are herein incorporated by reference in their entirety.

BACKGROUND

1. Field

Embodiments of the disclosure relate to a method and an apparatus for transmitting and receiving a signal applying error-correcting codes. More particularly, embodiments of the disclosure relate to a method and an apparatus related to encoding and decoding of polar coding.

2. Description of Related Art

To meet the increasing demand for wireless data traffic since the deployment of 4G communication systems, efforts have been made to develop an improved 5G or pre-5G communication system. Therefore, the 5G or pre-5G communication system is also called a "beyond 4G network" communication system or a "post LIE System." Implementation of the 5G communication system in ultrahigh frequency (mmWave) bands, e.g., 60 GHz bands, is being considered in order to accomplish higher data rates. To mitigate a path loss of the radio waves and increase the transmission distance on the radio waves in the ultrahigh frequency bands, beamforming, massive multiple-input multiple-output (massive MIMO), full dimensional MIMO (FD-MIMO), array antenna, analog beamforming, and large scale antenna techniques are being discussed for 5G communication systems. In addition, in 5G communication systems, development for system network improvement is under way based on evolved small cells, advanced small cells, cloud radio access networks (cloud RANs), ultra-dense networks, device-to-device (D2D) communication, wireless backhaul, moving network, cooperative communication, coordinated multi-points (COMP), reception-end interference cancellation, and the like. In addition, in the 5G system, hybrid FSK and QAM modulation (FQAM) and sliding window superposition coding (SWSC), as advanced coding modulation (ACM) systems, and filter bank multi carrier (FBMC), non-orthogonal multiple access (NOMA), and sparse code multiple access (SCMA), as advanced access technologies, have been developed.

On the other hand, the Internet, which is a human centered connectivity network where humans generate and consume information, is now evolving to the Internet of things (IoT) where distributed entities, such as things, exchange and process information without human intervention. The Internet of everything (IoE), which is a combination of IoT technology and big data processing technology through connection with a cloud server, has emerged. Technology elements, such as "sensing technology", "wired/wireless communication and network infrastructure", "service interface technology", and "security technology" have been demanded for IoT implementation; therefore, technologies, such as a sensor network, machine-to-machine (M2M) communication, machine type communication (MTC) for a connection between things, are recently researched. Such an IoT environment may provide intelligent Internet technology an services that create a new value for human life by collecting and analyzing data generated among connected things. IoT may be applied to a variety of fields including smart home, smart building, smart city, smart car or connected car, smart grid, health care, smart appliances, and advanced medical services through convergence and combination between existing information technology an and various industrial applications.

In line with this, various attempts have been made to apply 5G communication systems to IoT networks. For example, technologies such as a sensor network, machine-to-machine (M2M) communication, and machine type communication (MTC) may be implemented by beamforming, MIMO, and array antennas, which correspond to 5G communication technology. Application of a cloud radio access network (cloud RAN) as the above-described big data processing technology may also be considered to be an example of convergence between the 5G technology and the IoT technology.

In such a new communication system, there is a need for an encoding and decoding method applying error-correcting codes with more improved performance.

SUMMARY

The disclosure has been made in order to solve the above-described problems, and embodiments of the disclosure provide a method and an apparatus for encoding and decoding using error-correcting codes in a communication system. More specifically, embodiments of the disclosure provide a method and an apparatus for encoding and decoding using polar codes. Embodiments of the disclosure provide a polar code encoding/decoding method having more superior error-correcting performance with the same or almost similar decoding complexity and latency in comparison with repetition-based rate-matching. Further, embodiments of the disclosure provide a polar code encoding/decoding method remarkably lowering decoding complexity and latency while providing the same or almost similar error-correcting performance in comparison with puncturing/shortening-based rate-matching.

According to an embodiment of the disclosure in order to solve the above-described problems, a method by a transmitter for transmitting a signal in a communication system includes determining a mother code size and depth information for generating a parity bit; applying a polar code sequence corresponding to information bits; generating, based on the mother code size and the depth information, a codeword including the parity bit associated with at least two of a plurality of bits to which the polar code sequence is applied; and transmitting the generated codeword.

According to another embodiment of the disclosure, a method by a receiver for receiving a signal in a communication system includes receiving encoded codeword information from a transmitter; acquiring a mother code size and depth information for generating a parity bit; and decoding the received codeword based on the mother code size and the depth information, wherein the generated codeword includes the parity bit associated with at least two of a plurality of bits to which a polar code sequence is applied based on the mother code size and the depth information.

According to still another embodiment of the disclosure, a transmitter of a communication system includes a transceiver configured to transmit and receive signals; and a controller configured to control the transceiver, determine a mother code size and depth information for generating a parity bit, apply a polar code sequence corresponding to information bits, generate, based on the mother code size and the depth information, a codeword including the parity bit associated with at least two of a plurality of bits to which the polar code sequence is applied, and transmit the generated codeword.

According to yet still another embodiment of the disclosure, a receiver of a communication system includes a transceiver configured to transmit and receive signals; and a controller configured to control the transceiver, receive encoded codeword information from a transmitter, acquire a mother code size and depth information for generating a parity bit, and decode the received codeword based on the mother code size and the depth information, wherein the generated codeword includes the parity bit associated with at least two of a plurality of bits to which a polar code sequence is applied based on the mother code size and the depth information.

According to the embodiments of the disclosure, an encoding and decoding method capable of performing error-correcting is provided. More particularly, through applying of the encoding and decoding according to the embodiments of the disclosure, restoration possibility through the error-correcting is increased, and a substantial channel capacity can be extended.

BRIEF DESCRIPTION OF THE DRAWINGS

FIG. 24 is a diagram illustrating a decoding scheduling process according to an embodiment of the disclosure;

DETAILED DESCRIPTION

Figure 1:
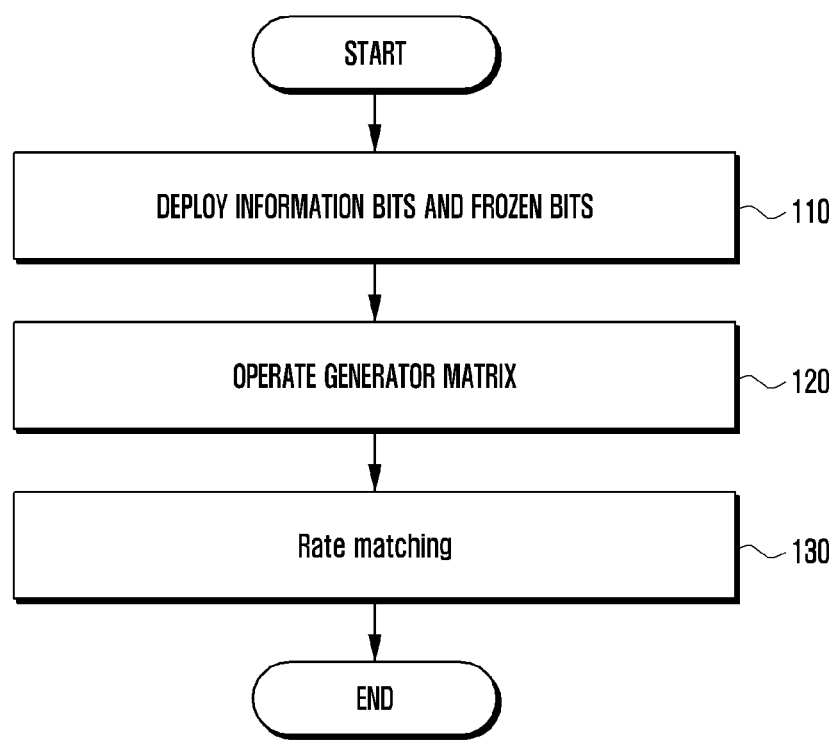
FIG. 1 is a diagram explaining an encoding method to which a polar code is applied according to an embodiment of the disclosure.

Hereinafter, embodiments of the disclosure will be described in detail with reference to the accompanying drawings.

In explaining the embodiments, explanation of technical contents that are well known in the art to which the disclosure pertains and are not directly related to the disclosure will be omitted. This is to transfer the subject matter of the disclosure more clearly without obscuring the same through omission of unnecessary explanations.

For the same reason, in the accompanying drawings, sizes and relative sizes of some constituent elements may be exaggerated, omitted, or briefly illustrated. Further, sizes of the respective constituent elements do not completely reflect the actual sizes thereof. In the drawings, the same drawing reference numerals are used for the same or corresponding elements across various figures.

The aspects and features of the disclosure and methods for achieving the aspects and features will be apparent by referring to the embodiments to be described in detail with reference to the accompanying drawings. However, the disclosure is not limited to the embodiments disclosed hereinafter, and it can be implemented in diverse forms. The matters defined in the description, such as the detailed construction and elements, are only specific details provided to assist those of ordinary skill in the art in a comprehensive understanding of the disclosure, and the disclosure is only defined within the scope of the appended claims. In the entire description of the disclosure, the same drawing reference numerals are used for the same elements across various figures.

In this case, it will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart block or blocks.

Also, each block of the flowchart illustrations may represent a module, segment, or portion of code, which includes one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

In this case, the term "~unit", as used in an embodiment, means, but is not limited to, a software or hardware component, such as FPGA or ASIC, which performs certain tasks. However, "~unit" is not meant to be limited to software or hardware. The term "~unit" may advantageously be configured to reside on the addressable storage medium and configured to execute on one or more processors. Thus, "~unit" may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and "~units" may be combined into fewer components and "~units" or further separated into additional components and "~units". Further, the components and "~units" may be implemented to operate one or more CPUs in a device or a security multimedia card.

A polar code may have a low encoding performance and low complexity because of an error-correcting code, and may have a performance that is equal to or higher than a predetermined level. Further, the polar code is a code capable of achieving a channel capacity that is a data transmission limit in all binary discrete memoryless channels. Further, the polar code may have a similar performance to that of a turbo code or a low-density parity-check (LDPC) code that is another channel capacity proximity code, and it may have a performance merit in the case of transmitting a code having a short length in comparison with other codes. Accordingly, signal transmission and reception applying the polar code may be performed in the whole communication system, and more particularly, it may be considered to use the polar code for the purpose of transmitting control information having a predetermined length or less.

Further, the polar code is an error correction code that may be defined based on a channel polarization phenomenon under the assumption of a binary discrete memoryless channel (B-DMC). In the case of applying the polar code as described above, each bit may correspond to a channel W that is independent and has statistically the same characteristic. In this case, if it is assumed that the channel capacity of each channel is $0 \leq C(W) \leq 1$, information as much as $C(W)$ bit can theoretically be transferred in the case where one certain bit is transmitted through the channel. In the case of transmitting N bits through the B-DMC without any operation, each channel on which each bit is transmitted may have the channel capacity of $C(W)$, and thus information as much as $N \times C(W)$ bits in total may theoretically be transferred. According to the basic concept of the channel polarization, it is possible to make adjustment so that channels on which N bits pass are combined and split, and thus the channel capacity of an effective channel that bits of a specific ratio undergo becomes a value that is close to "1", whereas the channel capacity of the effective channel that the remaining bits undergo becomes a value that is close to "0". Through the simple conceptual explanation of the polar code, transmission effects can be maximized by transmitting information bits on channels having high channel capacity after the channel polarization and fixing specific values on channels having low channel capacity without carrying the information bits thereon.

FIG. 1 is a diagram explaining an encoding method to which a polar code is applied according to an embodiment of the disclosure.

With reference to FIG. 1, an encoding process to which a polar code is applied may be disclosed.

It is assumed that the length of an information bit intended to be transmitted in a communication system is K, and the length of the information bit transmitted through a channel is N. In this case, a code rate may be defined as K/N. The polar code encoding may be considered as a process of combining B-DMC channels on which different bits are transmitted.

At operation 110, an encoder may deploy information bits and frozen bits for transmission.

At operation 120, the encoder may perform encoding through a generator matrix operation.

At operation 130, the encoder may determine bits actually transmitted through rate-matching.

The encoder may deploy information bits intended to be transmitted and frozen bits. More specifically, the encoder may make a bit vector having a length of $N_o$ by adding frozen bits having a length of $N_o-K$ to an information bit vector $b=(b_0, b_1, \ldots, b_{K-1})$ having a length of K intended to be transmitted. In this case, the frozen bit is a bit having a value engaged between the encoder and a decoder, and "0" may be used as the frozen bit, but the frozen bit is not limited thereto. In an embodiment, $N_o$ means the size of a mother code for proceeding with encoding and decoding, and it is determined as a certain power $2^n$ of 2 that is larger than K. Although $N_o$ is normally determined as $N_O=2^{\log_2[N]}$, there is no limit except that it is larger than K.

Further, in an embodiment, the performance of the polar code is determined by how to deploy frozen bits and information bits on vector u in the above-described process. In the case of the channel polarization as described above, it may seem like a part of the vector u has been transmitted through a very good channel and the remaining partial bits have been transmitted through a very bad channel. A channel that each bit undergoes is called a polarized sub-channel, and the channel capacity after the channel polarization of each sub-channel or a corresponding metric can be obtained by a technique, such as density evolution. For performance optimization based on such a measured value, it may be determined how to deploy the information bits and the frozen bits on the vector u.

In this case, because of the puncturing or shortening at a rate-matching operation, a partial sub-channel may compulsorily become the frozen bits regardless of measured values. The order of such frozen bits (or information bits) is recorded and used as a sequence, and this sequence is called a polar code sequence.

If the vector u is given as described above, vector x is obtained through encoding of the polar code. The vector x has the same length of $N_o$, and it may be calculated to satisfy the following equation.

$$x = uG$$

Here, G is a generator matrix of the polar code having a length of $N_0 = N_0$. The generator matrix of the polar code may be determined as $G = B_{N_0} F^{\otimes log_2 N_0}$, and it may be determined as $G = F^{\otimes log_2 N_0}$ that is a slightly simpler form. Here, $F^{\otimes log_2 N_0}$ is a matrix that is calculated through Kronecker power operation as many as the number of times of $log_2 N_0$ in an elementary 2×2 matrix $$F = \begin{bmatrix} 1 & 0 \\ 1 & 1 \end{bmatrix}.$$

For example, $F^{\otimes 2}$, $F^{\otimes 3}$ are calculated as follows.

$$F^{\otimes 2} = \begin{bmatrix} F & 0 \\ F & F \end{bmatrix} = \begin{bmatrix} 1 & 0 & 0 & 0 \\ 1 & 1 & 0 & 0 \\ 1 & 0 & 1 & 0 \\ 1 & 1 & 1 & 0 \end{bmatrix}$$

$$F^{\otimes 3} = \begin{bmatrix} F^{\otimes 2} & 0 \\ F^{\otimes 2} & F^{\otimes 2} \end{bmatrix} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

The two generator matrices as described above are different from each other on the point of whether to perform $B_{N_0}$ matrix multiplication. The matrix $B_{N_0}$ is a matrix that performs bit reverse with respect to the length $N_o$. For example, $B_{N_0}=4$ may be multiplied by a bit vector, such as $(b_0, b_1, b_2, b_3)$, to calculate a bit vector $(b_3, b\ b_2, b_1, b_0)$ of which the bit order has been reversed. Accordingly, the difference between the two generator matrices corresponds to whether to redeploy the results in a bit-reversal manner. In the disclosure, explanation will be made on the assumption that the generator matrix is given as $G = B_{N_0} F^{\otimes log_2 N_0}$, but the generator matrix is not limited thereto. According to circumstances, if a separate explanation is necessary, a case where the generator matrix is $G = F^{\otimes log_2 N_0}$ may be additionally explained.

Figure 2:
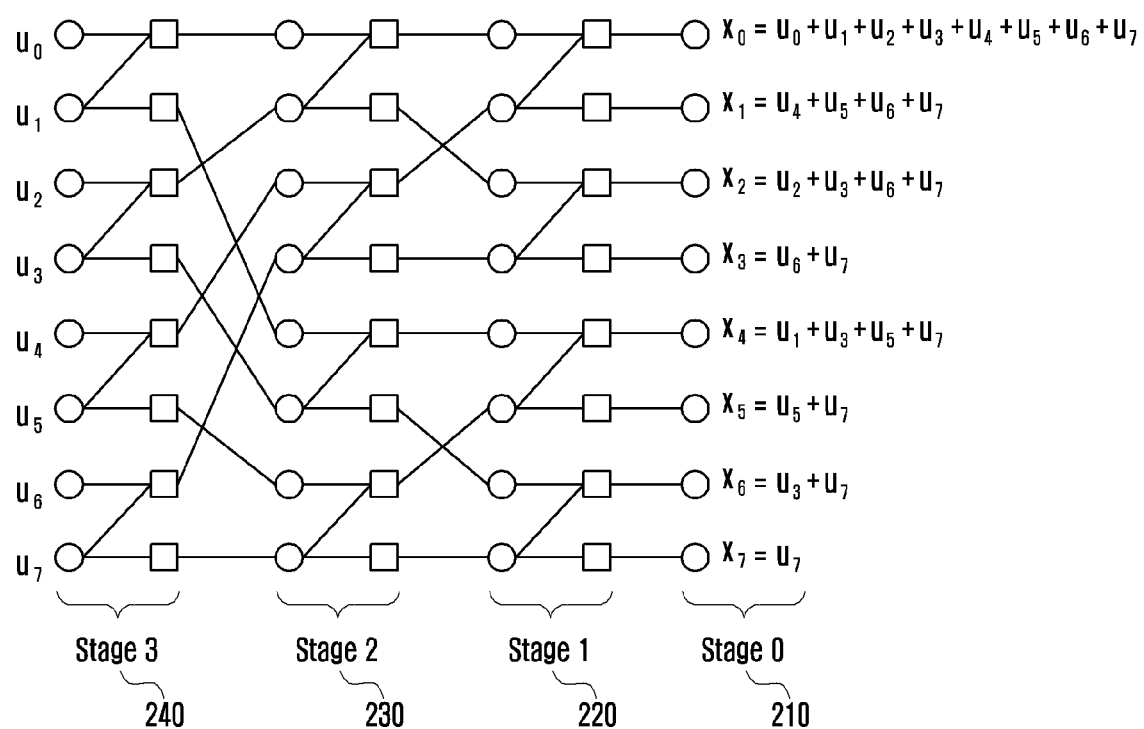
FIG. 2 is a diagram illustrating one structure of a polar code according to an embodiment of the disclosure.

FIG. 2 is a diagram illustrating one structure of a polar code according to an embodiment of the disclosure.

With reference to FIG. 2, a polar code structure in which $N_0 = 8$ is given, and a generator matrix is given as $G = B_{N_0} F^{\otimes log_2 N_0}$ is disclosed. More specifically, if $N_0 = 8$ and $G = B_{N_0} F^{\otimes log_2 N_0}$ are given, an encoding process, such as x=uG, may be expressed on a bipartite graph. The calculation process through the bipartite graph may be represented by respective stages 310 to 340. Further, in the bipartite graph, the leftmost variable nodes depict respective bits of the bit vector u before being encoded, and the rightmost variable nodes represent the vector X after being encoded.

In this case, a generator matrix G is as follows.

$$G_8 = B_8 F^{\otimes 3} = \begin{bmatrix} 1 & 0 & 0 & 0 & 0 & 0 & 0 & 0 \\ 1 & 0 & 0 & 0 & 1 & 0 & 0 & 0 \\ 1 & 0 & 1 & 0 & 0 & 0 & 0 & 0 \\ 1 & 0 & 1 & 0 & 1 & 0 & 1 & 0 \\ 1 & 1 & 0 & 0 & 0 & 0 & 0 & 0 \\ 1 & 1 & 0 & 0 & 1 & 1 & 0 & 0 \\ 1 & 1 & 1 & 1 & 0 & 0 & 0 & 0 \\ 1 & 1 & 1 & 1 & 1 & 1 & 1 & 1 \end{bmatrix}$$

In an embodiment, the bipartite graph of the polar code having the length of $N_o$ may be configured in the form in which a structure of total $log_2 N_0$ stages is repeated. In each stage index of the graph, the leftmost corresponds to $log_2 N_0$ (in an embodiment, stage 3 340), and the rightmost corresponds to stage 0 310. In the graph, each circle is called a variable node, and it indicates bit value 0 or 1. Further, each rectangle denotes a check node indicating that a binary sum (modulo-2 sum or XOR) of all connected variable node values is 0. The encoding and decoding of the polar code may be performed based on such a linear equation relationship between the variable node and the check node.

As described above, an encoded vector may be generated from the bit vector based on the bipartite graph or the generator matrix.

Figure 3:
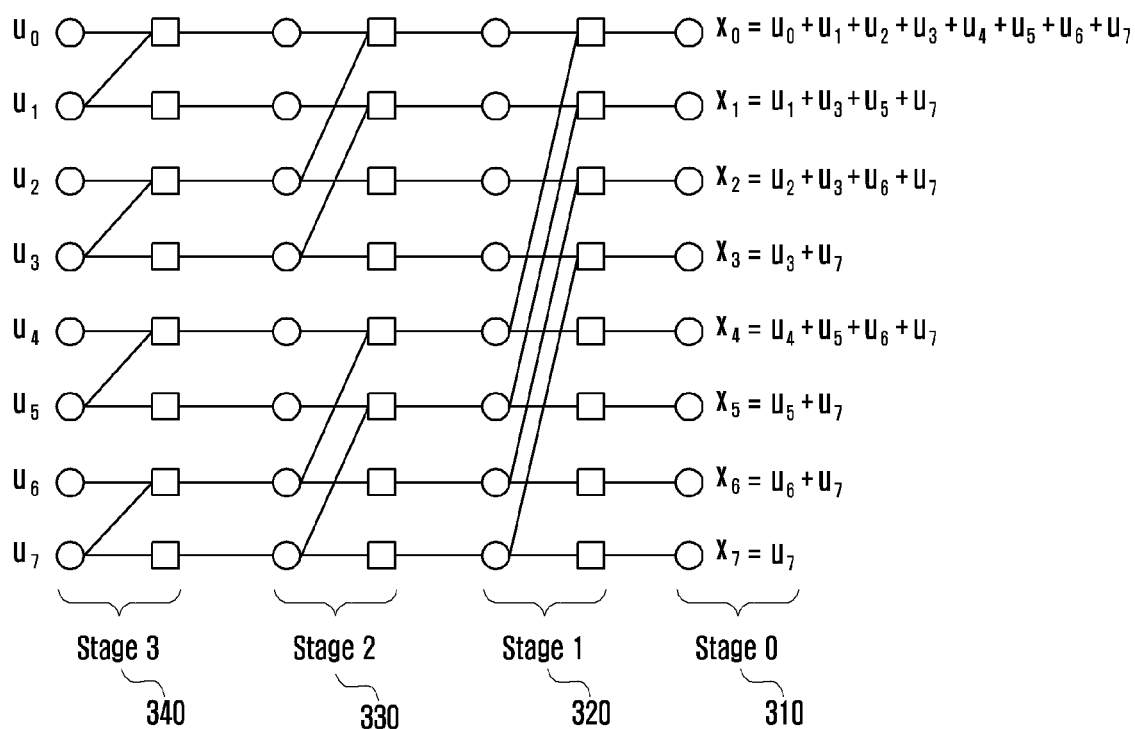
FIG. 3 is a diagram illustrating another structure of a polar code according to an embodiment of the disclosure.

FIG. 3 is a diagram illustrating another structure of a polar code according to an embodiment of the disclosure.

With reference to FIG. 3, a polar code structure in which $N_0 = 8$ is given, and a generator matrix is given as $G = F^{\otimes log_2 N_0}$ is disclosed. More specifically, if $N_0 = 8$ and $G = F^{\otimes 2 N_0}$ are given, the relationship of the equation x=uG and the encoding process may be expressed on the bipartite graph. In this case, a generator matrix G is as follows.

$$G_8 = F^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

The graph for $G = F^{\otimes log_2 N_0}$ of FIG. 3 also has features corresponding to those of the graph for $G = B_{N_0} F^{\otimes log_2 N_0}$ of FIG. 2, and only their connection types between variable nodes and check nodes are different from each other. Even if any one of the two different types of generator matrices and bipartite graphs is used, encoding and decoding processes may be performed accordingly. An encoded vector may be generated from the bit vector based on the bipartite graph or the generator matrix.

Figure 4:
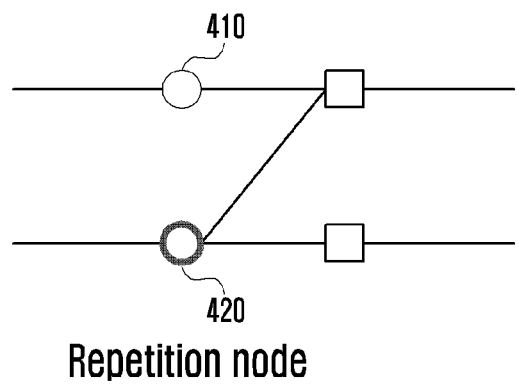
FIG. 4 is a diagram illustrating constituent elements of a graph for applying a polar code according to an embodiment of the disclosure.

FIG. 4 is a diagram illustrating constituent elements of a graph for applying a polar code according to an embodiment of the disclosure.

With reference to FIG. 4, basic constituent elements of a polar code graph are disclosed. More specifically, the graphs of FIGS. 2 and 3 may include the basic constituent elements of FIG. 4, which are connected to one another. In an embodiment, a variable node connected to only one check node may be called a single parity-check node (SPC node) 410, and a variable node connected to two check nodes may be called a repetition node 420. In an embodiment, respective divided variable nodes may perform different operations during decoding.

The encoding operation may include calculation of vector x that satisfies x=uG using vector u including generator matrix G of a given polar code and information bits. There may be several methods for implementing such encoding. As an example, there is an encoding method through operations by stages on the graphs of FIGS. 2 and 3. Using this method, the encoding process may be performed in a direction from the left stage to the right stage on the graphs of FIGS. 2 and 3 even if any one of the above-described generator matrices is used. First, bits of the vector u are substituted for $N_o$ leftmost variable nodes on the graph. In a check node for each stage, right variable node values are calculated from left variable node values using a linear equation relationship in which the binary sum of all connected variable nodes is 0. In the case of a check node of which the degree (the number of connection lines connected to the node) is 3, a right variable node bit value can be calculated by XOR-gating two left variable node bit values. Further, in the case of a check node of which the degree is 2, a left variable node bit value becomes a right variable node bit value as it is. By performing such a process by stages, it is possible to calculate bit values corresponding to the rightmost variable nodes of stage-0, and these values become the vector x having the length of $N_0$. In the case of implementing the operations by stages on the graph, the minimum operations can be performed. The graph having the length of $N_o$ may include stages as many as $\log_2 N_0$ in total, and because $N_0/2$ times binary sum operations are performed for each stage, the vector x can be calculated through additions as many as $0.5 N_0 \log_2 N_0$ in total. Further, if $N_0/2$ times additions are simultaneously performed in one clock cycle, clock cycles necessary for the encoding become $\log_2 N_0$.

Further, a rate-matching method for making a codeword vector having a length of N to be actually transmitted from the vector x having an encoded length of $N_0$ as described above may be briefly divided into three types in accordance with the value of N.

First, in the case of $N_0=N$, x is transmitted as it is.

Second, in the case of $N_0>N$, the remaining bits obtained by subtracting $N_0-N$ bits from the vector x are transmitted. Here, non-transmitted bits may be punctured as in the method, and they may be treated as known bits, that is, shortening bits. The locations of bits that are punctured or shortened in the vector x may exert an influence on the performance, and in consideration of this, the bits to be punctured/shortened may be determined. More specifically, a transmission channel may substantially select at least one of the bits to be punctured and shortened based on the performance in accordance with the bit locations.

Third, in the case of $N_0<N$, $N-N_0$ bits in the vector x are repeatedly transmitted. In the same manner as the puncturing, the performance may differ in accordance with the locations of the bits repeated in the vector x, and thus the bits to be repeated and the locations of the bits to be repeated may also be determined in consideration of this. Even in this case, the transmission channel may substantially determine the locations of the bits to be repeated based on the performance in accordance with the bit locations.

Figure 5:
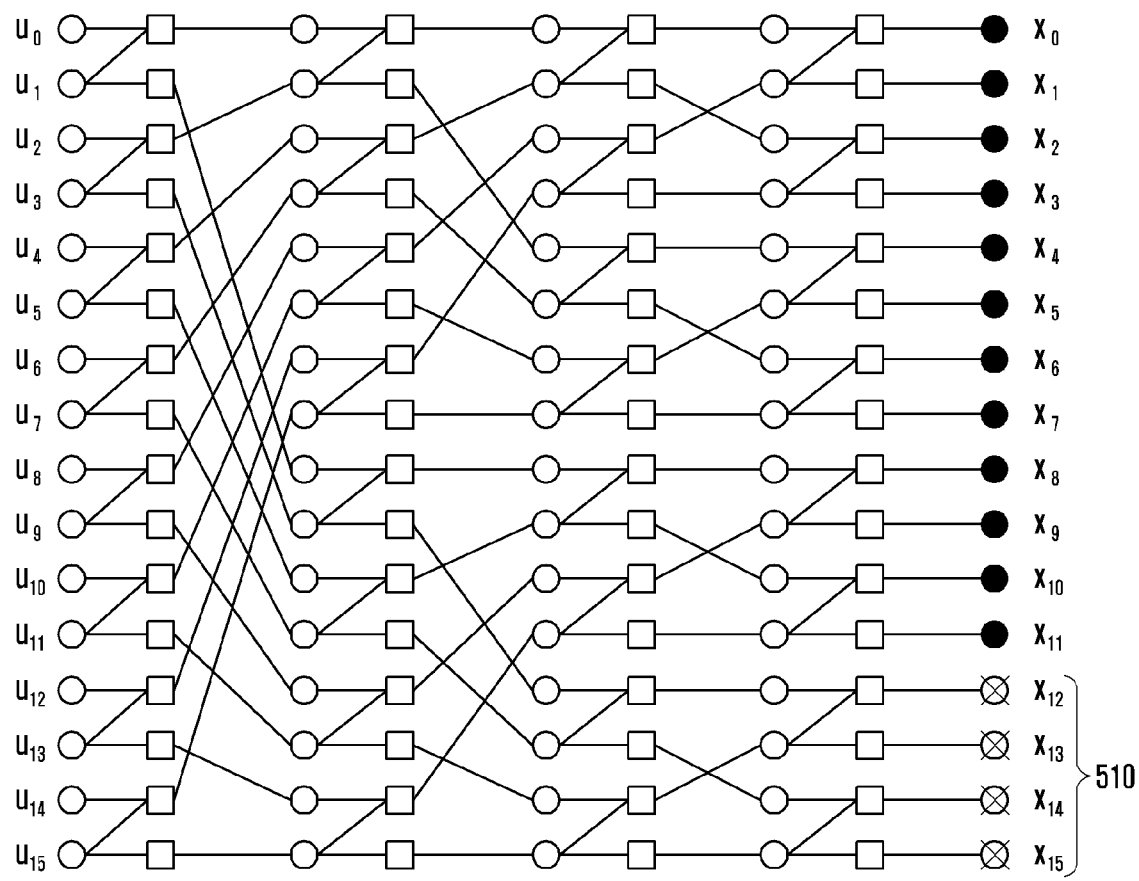
FIG. 5 is a diagram illustrating a puncturing/shortening-based rate-matching method according to an embodiment of the disclosure.

FIG. 5 is a diagram illustrating a puncturing/shortening-based rate-matching method according to an embodiment of the disclosure.

With reference to FIG. 5, a puncturing/shortening-based rate-matching method for N=12 transmissions in $N_0=16$ polar codes is disclosed. In an embodiment, $N_0=16$ and N=12 are determined, and in this case, because $N_0>N$ is determined, $N-N_0=4$ bits may be punctured or shortened. In this embodiment, it may be assumed that the bits are punctured in the order of bits, starting from the bit having a high bit index of the vector x. However, this is merely exemplary according to an embodiment, and the locations of the bits to be punctured may be determined based on the substantial channel performance in accordance with the encoding. According to the rate-matching in this embodiment, it is possible to make and transmit a codeword vector $\{x_0, x_1, \ldots, x_{11}\}$ by puncturing $\{x_{15},x_{14},x_{13},x_{12}\}$ 510 in $x=\{x_0,x_1,\ldots,x_{15}\}$ obtained through the encoding.

Figure 6:
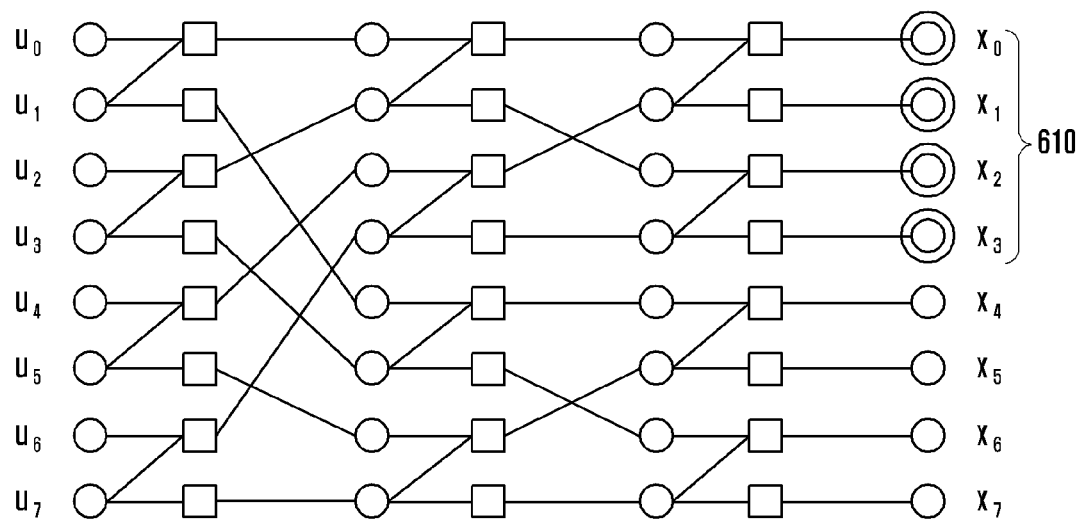
FIG. 6 is a diagram illustrating a repetition-based rate-matching method according to an embodiment of the disclosure.

FIG. 6 is a diagram illustrating a repetition-based rate-matching method according to an embodiment of the disclosure.

With reference to FIG. 6, a repetition-based rate-matching method for N=12 transmissions $N_0=8$ in polar codes is disclosed. This exemplifies the repetition-based rate-matching. In an embodiment, and $N_0=8$ are determined, and in this case, because $N_0<N$ is determined, $N-N_0=4$ bits may be repeatedly transmitted. In this embodiment, it may be assumed that the bits are repeatedly transmitted in the order of bits, starting from the bit having a low bit index of the vector x. However, this is merely exemplary according to an embodiment, and the locations of the bits to be repeated may be determined based on the substantial channel performance in accordance with the encoding. According to the rate-matching, it is possible to make and transmit a codeword vector $\{x_0,x_1,\ldots,x_7,x_0,x_1,x_2,x_3\}$ by repeating $\{x_0,x_1,x_2,x_3\}$ 610 in $x=\{x_0,x_1,\ldots,x_7\}$ obtained through the encoding.

The polar code decoding may include splitting of channels combined through the encoding process. Along with such a channel splitting operation, channel polarization may be performed. Hereinafter, decoding features will be briefly described.

First, log-likelihood ratio (LLR) values for respective bits of vector x having passed through channel W are calculated. If there are punctured bits in the vector x, the LLR values at the bit locations may be 0, whereas if there are shortened bits, the LLR values at the bit locations may be predetermined specific values. In an embodiment, the predetermined specific values may be large values, such as higher values of the LLR values, which may be given for the respective bits, and they may be applied in various manners according to embodiments.

If there are repeatedly transmitted bits in the vector x, LLR values of the repeated bits may be configured through addition of the LLR values for the repeatedly transmitted bits thereto. Through such calculation, all the LLR values for the respective bits of the vector x having a length of $N_0$ may be obtained and substituted for the rightmost variable nodes of FIGS. 2 and 3.

If the LLR values are configured, the decoding may be performed thereafter through successive cancellation (SC).

In the SC decoding process, respective bit values of the vector x may be successively decoded one by one, and after the decoding, the determined bits may be used to calculate bit values to be decoded thereafter.

As described above, using the LLR obtained from the channel, the LLR for $u_0$ is calculated through the SC. In this case, if $u_0$ is a frozen bit, the value is fixed to a predetermined value (e.g., 0), and otherwise, the bit value may be determined based on the LLR value. If the value of bit $u_0$ is determined, the LLR of $u_1$ may be calculated based on the LLR obtained from the channel and the bit value of $u_0$. That is, the LLR value of $u_1$ may be calculated when the LLRs obtained from the channels and hard-decision values of $u_0$ to $u_{i-1}$ values are given. Such a process is successively performed until values of $u_{N_0-1}$ are calculated.

Figure 7:
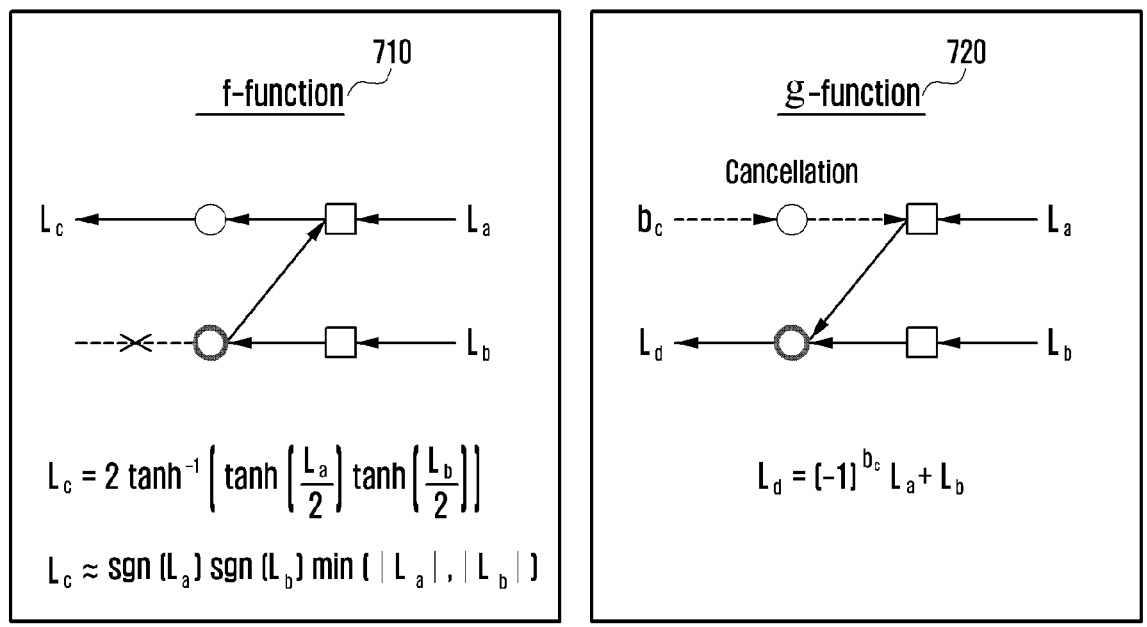
FIG. 7 is a diagram explaining a decoding method according to an embodiment of the disclosure.

FIG. 7 is a diagram explaining a decoding method according to an embodiment of the disclosure.

With reference to FIG. 7, operations of f-function 710 and g-function 720 that are performed during decoding are disclosed.

In an embodiment, in the SC decoding process, two kinds of operations are performed in accordance with the kind of variable nodes. In the single parity-check node of the basic constituent element of FIG. 4 as described above, the operation of the f-function 710 may be performed, whereas in the repetition node, the operation of the g-function 720 may be performed.

If a bit value of even any one of two variable node values of the basic constituent element is not predicted or determined, the f-function operation 710 is performed to calculate the LLR value for the single parity-check node. If it is assumed that two LLR values input from the right side of the basic constituent element are $L_a$ and $L_b$ in descending order thereof, the resultant LLR value $L_c$ by the f-function 710 may be calculated as $L_c=0 \tanh^{-1}(\tanh(L_a/2)\tanh(L_b/2))$. The resultant LLR value may also be calculated using an equation of $L_c \approx \text{sgn}(L_a)\text{sgn}(L_b)\min(|L_a|, |L_b|)$ that is approximated in a method normally called min-sum.

If the bit value for the single parity-check node of the basic constituent element is predicted or determined through hard decision, the LLR value for the repetition node may be calculated through the g-function operation 720. It is assumed that two LLR values input from the right side of the basic constituent element are $L_a$ and $L_b$ in descending order thereof, and the predicted or determined bit value of the single parity-check node is $b_c$. In this case, the LLR value $L_d$ of the repetition node may be calculated by the g-function function operation $L_d=(-1)^{b_c}L_a+L_b$.

With reference to such a decoding operation, in the SC decoding operation for the polar code having a length of $N_0$, the f-function operation 710 and the g-function operation 720 may be respectively performed $0.5 N_0 \log_2 N_0$ times. Such operations may be processed in clock cycles of $2N_0-2$. Accordingly, the decoding complexity and latency may be determined in proportion to the size $N_0$ of a used mother code rather than the information bit number K or the codeword bit number N.

Figure 8:
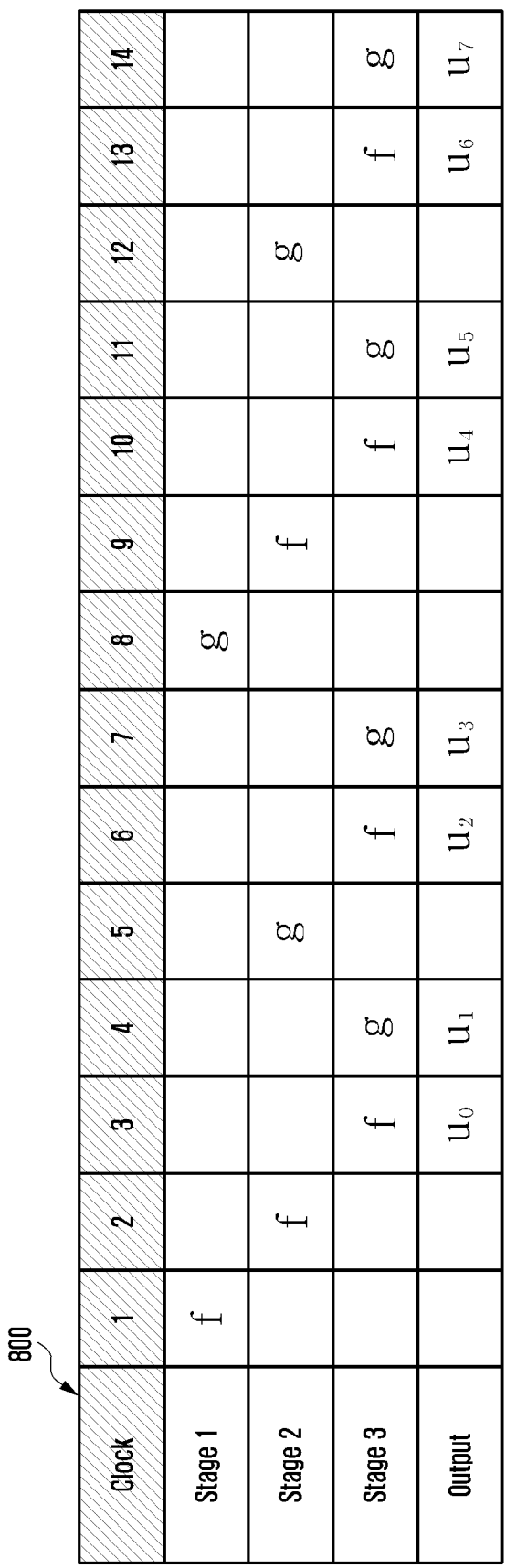
FIG. 8 is a diagram illustrating decoding scheduling using polar codes according to an embodiment of the disclosure.

FIG. 8 is a diagram illustrating decoding scheduling using polar codes according to an embodiment of the disclosure.

With reference to FIG. 8, scheduling of f-function and g-function of an SC decoder implemented in a polar code of $N_0=8$ is illustrated. Functions applied by stages in accordance with a clock cycle and corresponding resultant values are illustrated (800). First, a resultant value $u_0$ may be acquired by performing f-function operation (clock 1) through selection of one node of which the value is not determined among nodes of stage 1, performing f-operation (clock 2) at a corresponding node of stage 2, and then performing f-function operation at a corresponding node of stage 3. Thereafter, resultant values may be acquired by performing f-function operation and g-function operation in accordance with the clock cycle.

As described above, the basic size $N_0$ of the polar code has a value of a power of 2. Accordingly, a rate-matching operation for adjusting the code length and the code rate is carried out. If the transmission bit number N is larger than $N_0$, a specific bit should be repeatedly transmitted, and in this case, because the repetition bit does not provide any coding gain, the error-correcting performance may deteriorate. In contrast, if N is larger than $N_0$, the specific bit is punctured or shortened, and because such puncturing or shortening is not considered during polar code designing, it may cause the performance to deteriorate. Further, because the decoding is performed with a mother code having a length of $N_0$ that is larger than the code length N, the decoding complexity and latency may be increased. Accordingly, a method excluding the repetition or puncturing/shortening performed during the rate-matching may be considered.

In an embodiment of the disclosure, a method may be disclosed, in which data is encoded and transmitted using polar codes, and the encoded data is received and decoded. In this case, a method for encoding an extended polar code to perform the rate matching by inserting additional bits for the rate-matching may be considered. Further, a method for decoding a codeword of the encoded extended polar code may also be included.

Hereinafter, an extended polar code according to an embodiment of the disclosure is defined. The extended polar code may generate a codeword based on the above-described graph having the same type as the type of the polar code, and it may additionally transmit a bit value of a variable node existing in an intermediate stage of the graph as the codeword. In an embodiment, the variable node in the intermediate stage selected in accordance with the rate-matching may be any one of intermediate nodes to be transmitted. In an embodiment, as the intermediate node, a single parity-check node (SPC node) excluding a repetition node among the variable nodes may be selected, and an additional coding gain may be obtained through selection and transmission of the SPC nodes. In an embodiment, it is described that the SPC nodes are additionally selected, but it is not limited thereto. At least one of the repetition node and the SPC node may be selected and transmitted in consideration of at least one of the coding gain and the decoding complexity, but it is not limited thereto. At least one of the repetition node and the SPC node may be randomly selected.

Figure 9:
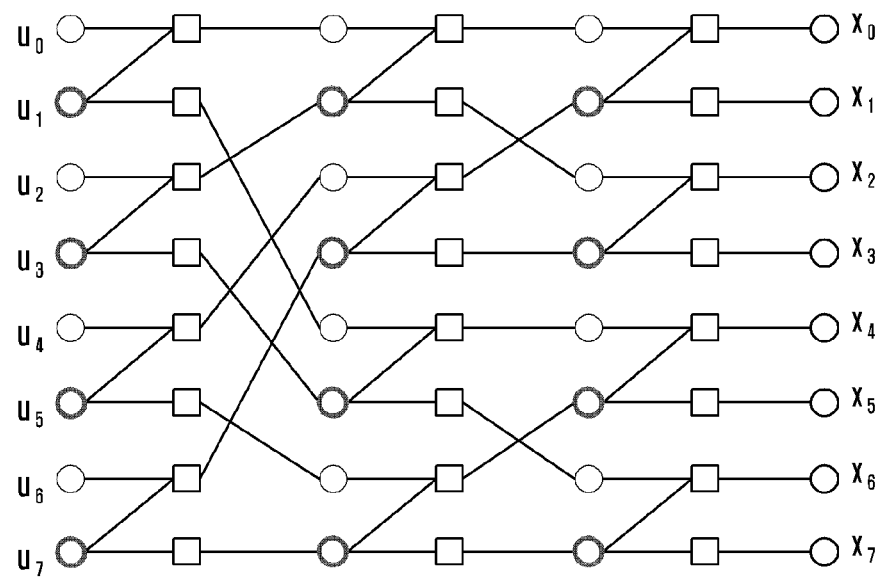
FIG. 9 is a diagram illustrating the configuration of each node in an encoding and decoding process using polar codes according to an embodiment of the disclosure.
Figure 9:
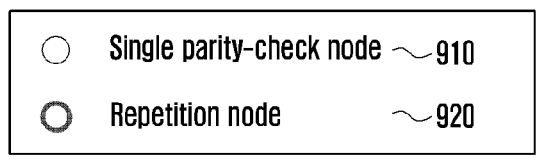
Figure 10:
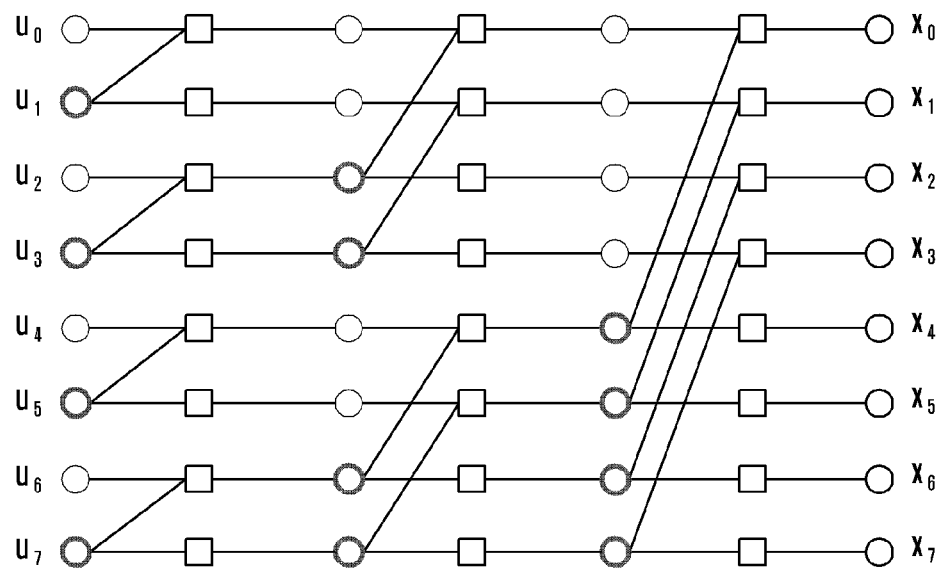
FIG. 10 is a diagram illustrating the configuration of each node in an encoding and decoding process using polar codes according to another embodiment of the disclosure.
Figure 10:
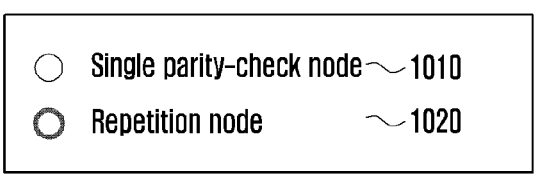

FIGS. 9 and 10 to be described hereinafter illustrate repetition nodes and single parity-check nodes in a graph of $N_0=8$ in consideration of bit-reversal based on the graph basic constituent element of FIG. 4 and in a graph of $N_0=8$ without considering the bit-reversal.

FIG. 9 is a diagram illustrating the configuration of each node in an encoding and decoding process using polar codes according to an embodiment of the disclosure.

With reference to FIG. 9, SPC nodes 910 and repetition nodes 920 in polar coding of $N_0=8$ in consideration of bit-reversal are disclosed.

FIG. 10 is a diagram illustrating the configuration of each node in an encoding and decoding process using polar codes according to another embodiment of the disclosure.

With reference to FIG. 10, SPC nodes 1010 and repetition nodes 1020 in polar coding of $N_0=8$ without considering bit-reversal are disclosed.

Vector x encoded in accordance with the bit-reversal as described above may be obtained, and although information constituting the vector x may differ depending on whether to consider the bit-reversal, the same result may be obtained in obtaining a coding gain through the polar coding.

As described above, although the basic structure of a polar code is determined by the size $N_0$, an extended polar code may be defined by the size $N_0=8$ and an extension depth d. In an embodiment, the extension depth d may be a natural number that is equal to or larger than 0 and equal to or smaller than $\log_2 N_0$. For convenience in explanation, an extended polar code having the size $N_0$ and the depth d may be $P(N_0,d)$. In an embodiment, a generator matrix of $P(N_0,d)$ may be defined as follows.

In the case of considering a bit-reversal matrix: $G_{ex}=B_{N_0}F^{\log_2 N_0}E_d P$ In the case of considering a bit-reversal matrix is not considered: $G_{ex}=F^{\log_2 N_0}E_d P$ A matrix $E_d$ newly added to the existing generator matrix is an extension matrix composed of identity matrices having different sizes, and P is a permutation matrix in which columns of the matrix Ed are deployed in a desired order.

The extension matrix $E_d$ may be defined in any type in order to transmit intermediate nodes in the existing polar code graph. In an embodiment, if it is considered to transmit only bits of a single parity-check node among intermediate nodes in order to maximally achieve the code gain, the extension matric $E_d$ may be defined as follows in accordance with the extension depth value d.

$$E_0 = I_{N_0,d}$$

$$E_1 = \left[ I_{N_0} \middle| \begin{array}{c} I_{N_0/2} \\ I_{N_0/2} \end{array} \right]$$

$$E_2 = \left[ I_{N_0} \middle| \begin{array}{cc} I_{N_0/2} & \\ I_{N_0/2} & \end{array} \middle| \begin{array}{cc} I_{N_0/4} & 0 \\ I_{N_0/4} & 0 \\ I_{N_0/4} & I_{N_0/4} \\ I_{N_0/4} & I_{N_0/4} \end{array} \right]$$

$$E_3 = \left[ I_{N_0} \middle| \begin{array}{c} I_{N_0/2} \\ I_{N_0/2} \end{array} \middle| \begin{array}{cc} I_{N_0/4} & 0 \\ I_{N_0/4} & 0 \\ I_{N_0/4} & I_{N_0/4} \\ I_{N_0/4} & I_{N_0/4} \end{array} \middle| \begin{array}{cccc} I_{N_0/8} & 0 & 0 & 0 \\ I_{N_0/8} & 0 & 0 & 0 \\ I_{N_0/8} & I_{N_0/8} & 0 & 0 \\ I_{N_0/8} & I_{N_0/8} & 0 & 0 \\ I_{N_0/8} & 0 & I_{N_0/8} & 0 \\ I_{N_0/8} & 0 & I_{N_0/8} & 0 \\ I_{N_0/8} & I_{N_0/8} & I_{N_0/8} & I_{N_0/8} \\ I_{N_0/8} & I_{N_0/8} & I_{N_0/8} & I_{N_0/8} \end{array} \right]$$

In the above equation, $I_N$ denotes an identity matrix having a size of N×N. In an embodiment, if the depth d is 0, $E_0$ denotes an identity matrix having a size of $N_0$. Starting from $E_0$, $E_d$ is a matrix in which a matrix $C_d$ having a size of $N_0=(N_0/2)$ is concatenated with the right-hand side of $E_{d-1}$, and it is expressed by $E_d=[E_{d-1}|C_d]$. The form of a matrix $C_d$ newly concatenated from $E_d$ to $E_{d-1}$ is as follows. First, in the same manner as making a generator matrix of a polar code, a base matrix $F^{\otimes d}$ may be generated using Kronecker power. Here, $$F = \begin{bmatrix} 1 & 0 \\ 1 & 1 \end{bmatrix}$$

is determined. Further, after remaining only odd-numbered columns in the generated matrix, $I_{N_0}/2^d$ matrix is substituted for the location of 1. For example, in the case of d=3, the newly concatenated matrix is generated in the following process.

$$F^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \Rightarrow$$

$$\begin{bmatrix} 1 & 0 & 0 & 0 \\ 1 & 0 & 0 & 0 \\ 1 & 1 & 0 & 0 \\ 1 & 1 & 0 & 0 \\ 1 & 0 & 1 & 0 \\ 1 & 0 & 1 & 0 \\ 1 & 1 & 1 & 1 \\ 1 & 1 & 1 & 1 \end{bmatrix} \Rightarrow C_3 \begin{bmatrix} I_{N_0/2^3} & 0 & 0 & 0 \\ I_{N_0/2^3} & 0 & 0 & 0 \\ I_{N_0/2^3} & I_{N_0/2^3} & 0 & 0 \\ I_{N_0/2^3} & I_{N_0/2^3} & 0 & 0 \\ I_{N_0/2^3} & 0 & I_{N_0/2^3} & 0 \\ I_{N_0/2^3} & 0 & I_{N_0/2^3} & 0 \\ I_{N_0/2^3} & I_{N_0/2^3} & I_{N_0/2^3} & I_{N_0/2^3} \\ I_{N_0/2^3} & I_{N_0/2^3} & I_{N_0/2^3} & I_{N_0/2^3} \end{bmatrix}$$

A permutation matrix P used during generator matrix designing may be designed to redeploy the order of all columns of $E_d$, or it may be designed to redeploy only the order of columns of the matrix $C_d$ newly concatenated for each depth. That is, it may be designed to redeploy only the order of columns in each depth.

An example of a process of generating a codeword using $P(N_0,d)$ is as follows, and it may be described with reference to FIG. 2. However, the codeword generation procedure is not limited to the following items, but it may be diversely modified.

1) In the same manner as the polar code method, a generator matrix G is multiplied after vector u is generated. This process may be understood as in the bipartite graph of FIG. 2.
2) $N_0$ bits corresponding to all variable nodes located in stage 0 are selected as codeword bits.
3) Bits calculated in a single parity-check node located in stage 1 are selected. In the existing polar code, non-selected bits are called additional parities. The additional parities may be in ascending order of indexes or in descending order of indexes. Further, an optimized order may be determined using density evolution or an experimental method. The order as described above may be defined by the permutation matrix P.
4) The above-described process 2) may be repeated from stage-2 to stage-d. The order of stages may be configured in diverse manners, but it is generally considered to select codeword bits in ascending order of indexes.

Generation of a codeword of an extended polar code may follow the ascending order of indexes of stages. This is to exclude repeatedly transmitted bits, and to maximally obtain the coding gain. Further, decoding time (latency) can also be reduced at the same time. Hereinafter, it will be described how repetition nodes are excluded in a graph of a polar code reflecting the bit-reversal.

Figure 11:
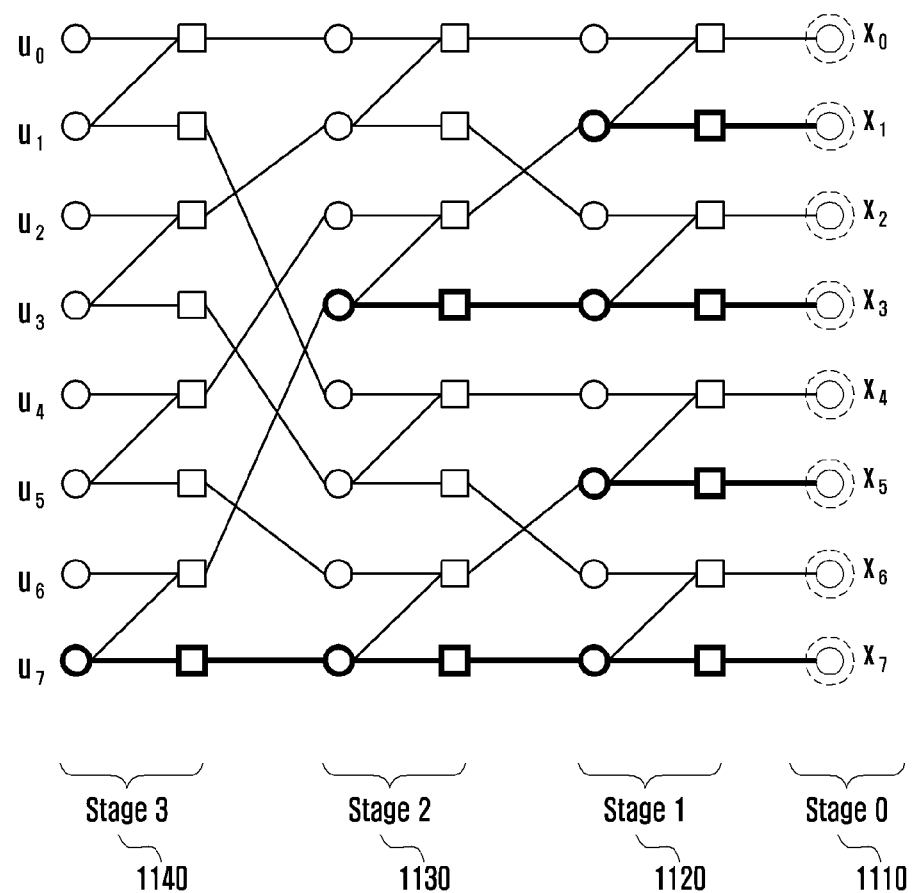
FIG. 11 is a diagram explaining an operation performed by each node in an encoding and decoding process using polar codes according to an embodiment of the disclosure.

FIG. 11 is a diagram explaining an operation performed by each node in an encoding and decoding process using polar codes according to an embodiment of the disclosure.

With reference to FIG. 11, the same nodes generated when bits of stage-0 1110 are selected in a graph of $N_0=8$ considering bit-reversal are disclosed. If bits corresponding to all variable nodes of stage-0 1110 indicated by dotted lines are selected as codeword bits, partial bits of stage-1 1120, stage-2 1130, and stage-3 1140 indicated by thick lines in accordance with the node relationship on a graph have the same values as those of already selected codeword bits. At stage-1 1120, variable nodes having indexes $\{1, 3, 5, \ldots, N_0-1\}$, that is, odd indexes, become the same nodes, and such nodes are always repetition nodes. Accordingly, repetition nodes of stage-1 1120 are excluded, and the bits of the single parity-check node are selected as the codeword bits. However, in accordance with embodiments, a part or all of the repetition nodes may be selected as the codeword bits.

Figure 12:
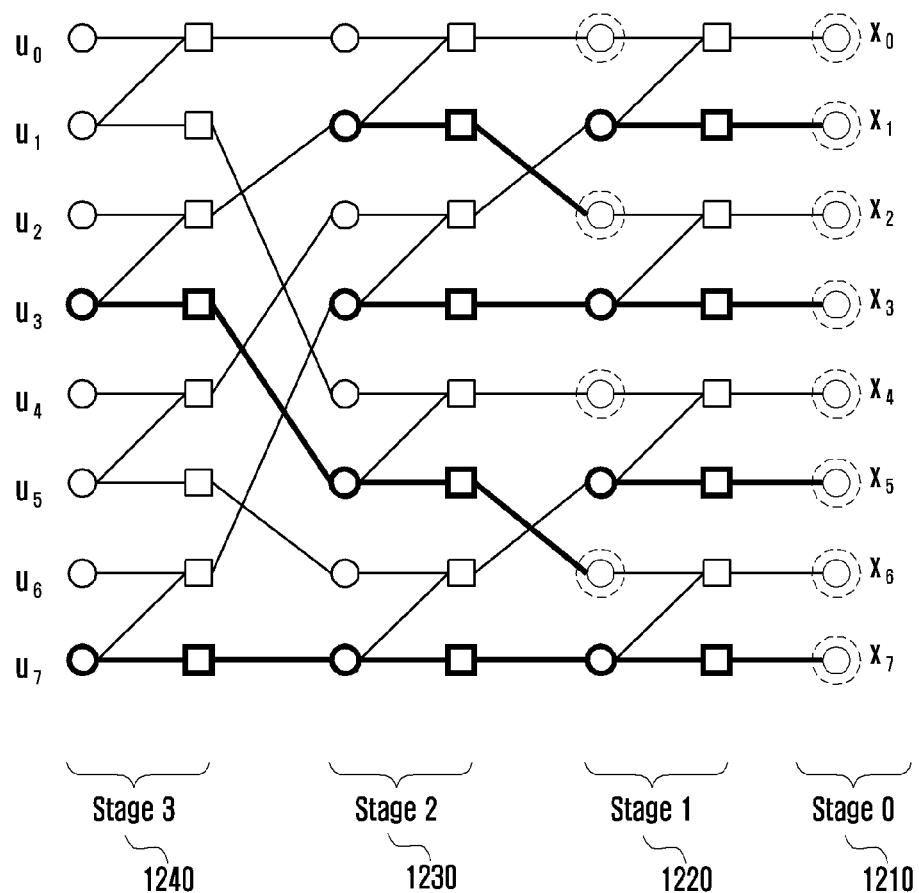
FIG. 12 is another diagram explaining an operation performed by each node in an encoding and decoding process using polar codes according to an embodiment of the disclosure.

FIG. 12 is another diagram explaining an operation performed by each node in an encoding and decoding process using polar codes according to an embodiment of the disclosure.

With reference to FIG. 12, the same nodes generated when bits of stage-0 1210 and stage-1 1220 are selected in a graph of $N_0=8$ considering bit-reversal are disclosed.

If a single parity-check node of stage-1 1220 as indicated by dotted lines is selected as codeword bits, partial variable nodes of stage-2 1230 and stage-3 1240 have the same values as those of partial bits additionally selected as the codeword bits. In an embodiment, repetition nodes may be indicated by thick solid lines.

In particular, the repetition nodes of stage-2 1230 have the same values as parts of the codeword bits. If the codeword bits are successively selected by stages as described above, all the repetition nodes of the next stage may always be the same nodes as parts of the already selected codeword bits. Accordingly, in order to obtain the maximum coding gain, the repetition nodes may be excluded, and the single parity-check nodes may be selected as the codeword bits in the order of stages up to the depth-d.

Figure 13:
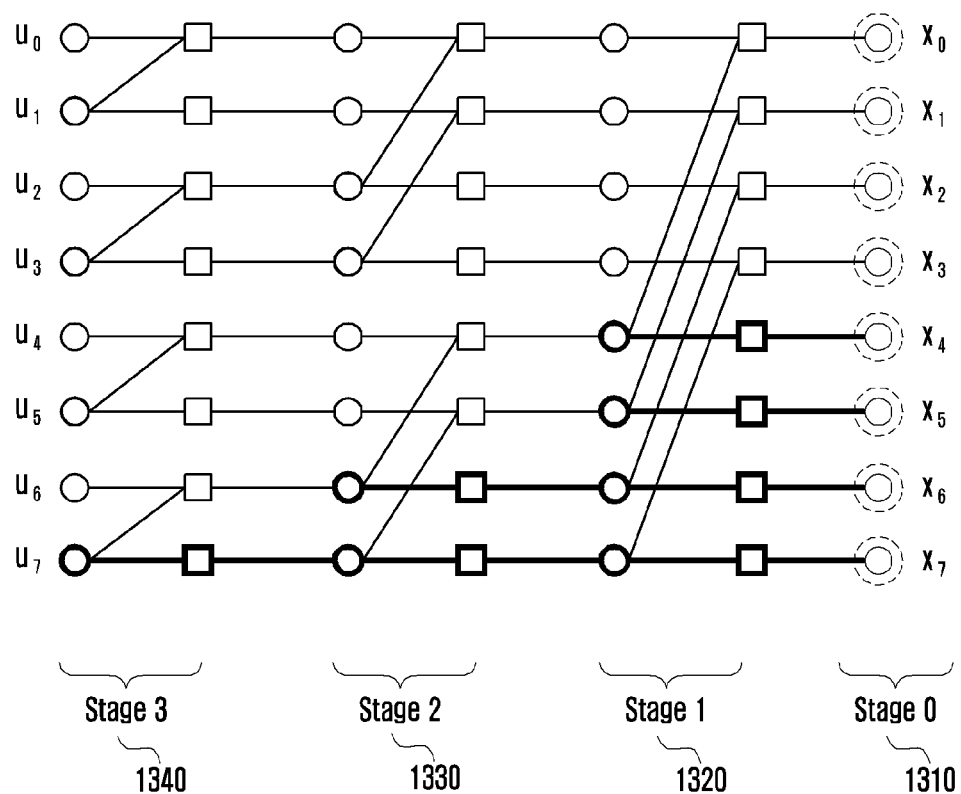
FIG. 13 is a diagram explaining an operation performed by each node in an encoding and decoding process using polar codes according to another embodiment of the disclosure.

FIG. 13 is a diagram explaining an operation performed by each node in an encoding and decoding process using polar codes according to another embodiment of the disclosure.

With reference to FIG. 13, the same nodes generated when bits of stage-0 1310 are selected in a graph of $N_0=8$ without considering bit-reversal are disclosed. Selected nodes may be indicated by dotted lines, and repetition nodes may be indicated by thick solid lines.

Figure 14:
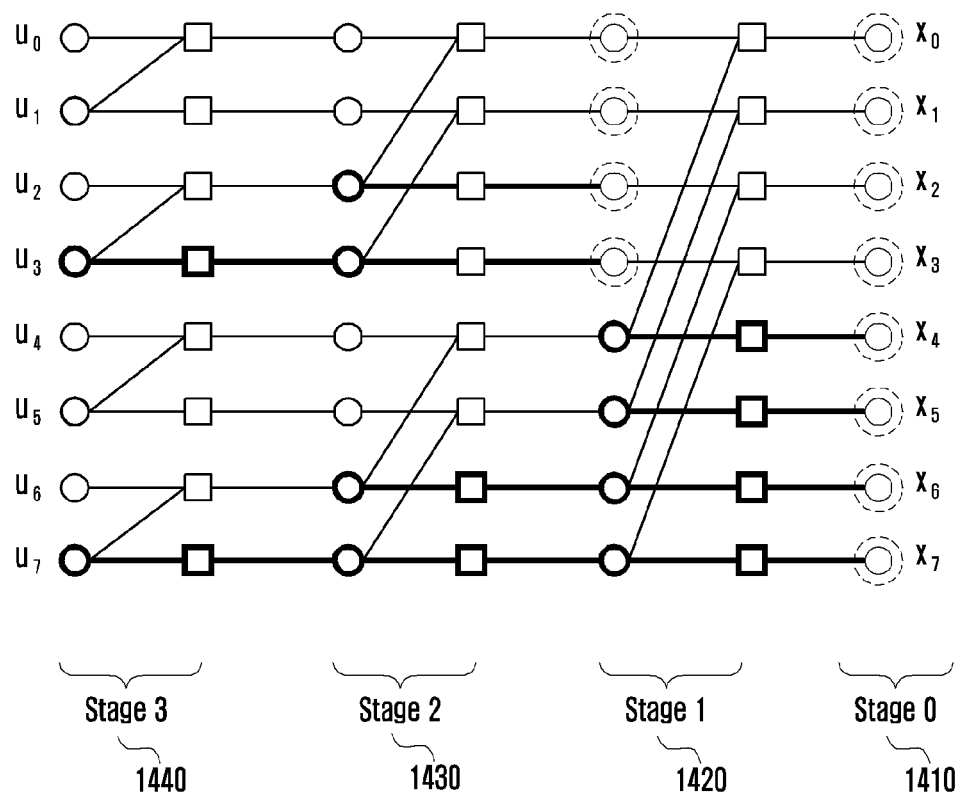
FIG. 14 is another diagram explaining an operation performed by each node in an encoding and decoding process using polar codes according to another embodiment of the disclosure.

FIG. 14 is another diagram explaining an operation performed by each node in an encoding and decoding process using polar codes according to another embodiment of the disclosure.

With reference to FIG. 14, the same nodes generated when bits of stage-0 1410 and stage-1 1420 are selected in a graph of $N_0=8$ without considering bit-reversal are disclosed. Selected nodes may be indicated by dotted lines, and repetition nodes may be indicated by thick solid lines.

As described above, regardless of whether to consider the bit-reversal, the repetition nodes may have the same bit values in the order of stages. Accordingly, when the codeword is selected, the bit values corresponding to the repetition nodes may not be selected, but an embodiment is not limited thereto.

Figure 15:
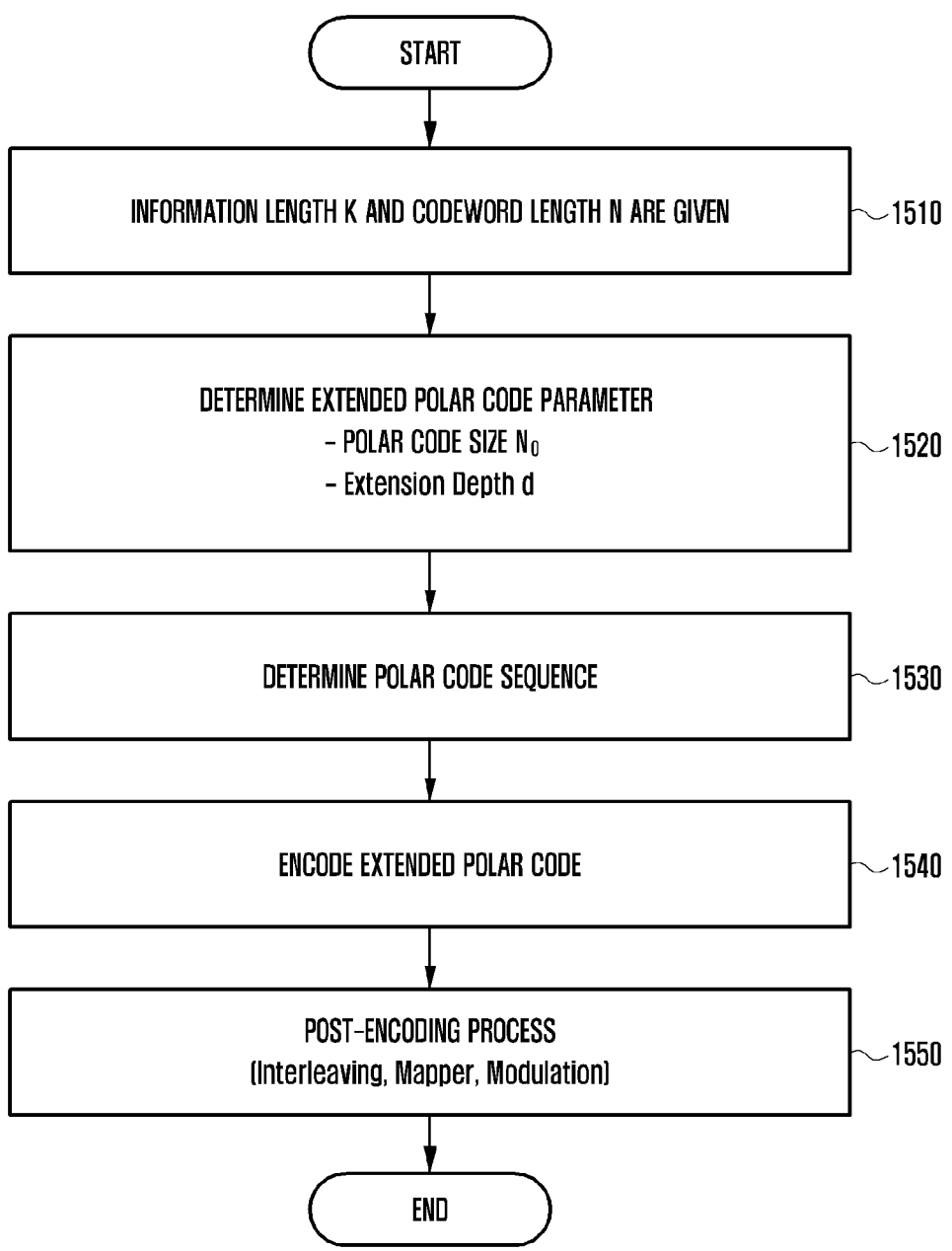
FIG. 15 is a diagram illustrating an operation of a transmitter including an encoding process according to an embodiment of the disclosure.

FIG. 15 is a diagram illustrating an operation of a transmitter including an encoding process according to an embodiment of the disclosure.

With reference to FIG. 15, an operation of a transmitter applying an extended polar code according to an embodiment of the disclosure is disclosed.

At operation 1510, information bits K to be transmitted and a codeword length may be determined. They may be given in accordance with the system configuration or they may be determined by the transmitter. More specifically, the number K of information bits intended to be transmitted may be given, and the length N of the codeword that can be transmitted based on at least one of the given K, channel resources, the modulation order, and the code rate may be determined. In an embodiment, values of K and N may be given to the transmitter in accordance with the system configuration, or they may be determined by the transmitter.

At operation 1520, the transmitter may determine a parameter of an extended polar code to be used for encoding. More specifically, the parameter of the extended polar code may include at least one of a code size $N_0$, an extension depth d, and a sequence in which the order of frozen bits (or unfrozen bits) is defined. If the parameter is determined, encoding may be performed with the extended polar code having the corresponding parameter.

More specifically, the transmitter may determine the parameter $N_0$ of the extended polar code and d based on the given information bit number K and the codeword bit number N. Maximum values $N_0^{max}$ and d that $N_0$ and d can have may be predetermined by an implemented device, standard, or technical document. However, the maximum values are not limited thereto, but they may be variably determined. Further, if repetition of partial or all codeword bits is permitted, any combination of $N_0$ and d may be used in accordance with a predetermined rule. In order to maximally obtain the code gain, it is preferable to reduce the repetition, and in this case, $N_0$ and d as large as possible in a predetermined range may be used. If the repetition is not considered, the maximum number of codeword bits that can be generated without repeated transmission in $P(N_0,d)$ structure in accordance with the definition of the extended polar code is $N_0(1+0.5d)$. Accordingly, if the codeword bits having a length N are transmitted without repetition using the extended polar code, it is possible to select $P(N_0,d)$ that satisfies the condition $N \leq N_0(1+0.5d)$. If this condition is satisfied, combination of $N_0$ and d can be freely selected. If any one of two parameters is prefixed, the following embodiments may follow.

1) If the size $N_0$ of a mother code to be used is fixed, the value d may be determined so as to satisfy the condition $d \geq 2(N/N_0-1)$. If the minimum extension depth is used with this condition satisfied, the value d becomes $d=\lceil 2(N/N_0-1)\rceil$. If the maximum value of the extension depth is predetermined, the value d is determined as $d=\min(\lceil 2(N/N_0-1)\rceil, d_{max})$.

2) If the depth d is fixed, the value $N_0$ may be determined so as to satisfy the condition $N_0 \geq N/(1+0.5d)$. If the smallest mother code size that satisfies this condition is used, the condition becomes) $N_0=2^{\lceil N/(1+0.5d)\rceil}$. If the maximum size of the mother code is predetermined, the condition is determined as $N_0=\min(2^{\lceil N/(1+0.5d)\rceil}, N_0^{max})$.

At operation 1530, the transmitter may determine a polar code sequence. More specifically, the polar code sequence in which frozen bits (or unfrozen bits) are recorded in order may be determined based on at least $N_0$ and d determined at operation 1520. According to an embodiment, one of several sequences pre-stored in a memory of a device may be selected in accordance with values of $N_0$ and d. Further, a sequence corresponding to the values of $N_0$ and d may be calculated and obtained through a specific function. The acquired polar code sequence may have a different value in accordance with the length values of $N_0$ and d, but it is not limited thereto. The same polar code sequence having the same $N_0$ may be used regardless of d.

At operation 1540, the transmitter may proceed with the extended polar code encoding based on at least one piece of information determined at operations 1520 and 1530. In an embodiment, the encoding may be performed in various methods. More specifically, the various methods may include at least one of 1) an intermediate node extraction method, 2) a new generator matrix use method, and 3) an outer code use method, and more detailed encoding schemes will be described later.

At operation 1550, the transmitter may generate symbols through processes of interleaving, mapping, and modulating the encoded codeword, and it may transmit the generated symbols.

Figure 16:
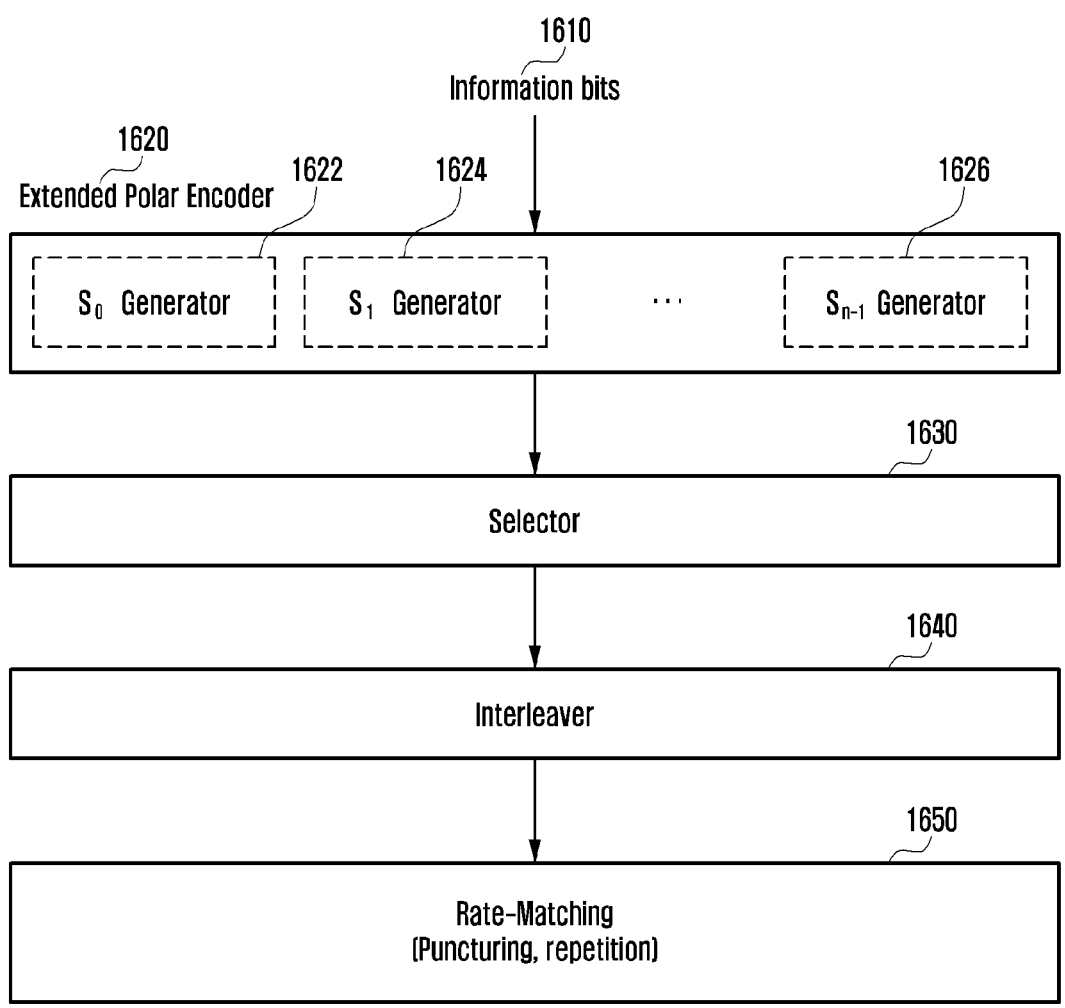
FIG. 16 is a diagram illustrating an encoding method according to a first embodiment of the disclosure.

FIG. 16 is a diagram illustrating an encoding method according to a first embodiment of the disclosure.

With reference to FIG. 16, an encoding method in which a transmitter uses intermediate nodes in the middle of encoding is disclosed. The transmitter may include an encoder, but the above-described operation may be performed by a controller.

In a graph of a polar code having a size of $N_0$, a set of bits obtained from variable nodes of the i-th stage is defined in the following equation.

$$S_i = \{S_{i,0}, S_{i,1}, S_{i,2}, \ldots, S_{i,N_0-1}\}$$

If information bits are input at operation 1610, an extended polar code encoder, at operation 1620, may generate bits $S_0, S_1, \ldots, S_{n-1}$ 1622, 1624, and 1626 that may be generated in respective stages using the information bits. Here, n may be a predetermined extended depth d, or it may be the whole length $\log_2 N_0$. Various methods for generating the bits $S_0 S_1, \ldots, S_{n-1}$ of the respective stages may exist, and they may be obtained in an operation process in the middle of graph-based encoding.

At operation 1630, if resultant bits are generated in respective stages, parts of the bits may be selected. All or parts of the bits may be selected in the respective stages, and no bit may be selected in a certain stage. There may be various bit selection methods, and as an example, all bits may be selected in $S_0$, and only bits corresponding to the single parity-check nodes on the graph may be selected in other stages.

At operation 1640, interleaving may be performed with respect to the bits obtained through the above-described selection process. The interleaving process may be applied to the respective bits selected in the respective stages, or it may be applied to all the selected bits regardless of the stages.

At operation 1650, rate-matching may be performed with respect to the interleaved information to select and transmit the bits to be used for transmission. In an embodiment, the rate-matching may include a puncturing method and a repetition method.

Figure 17:
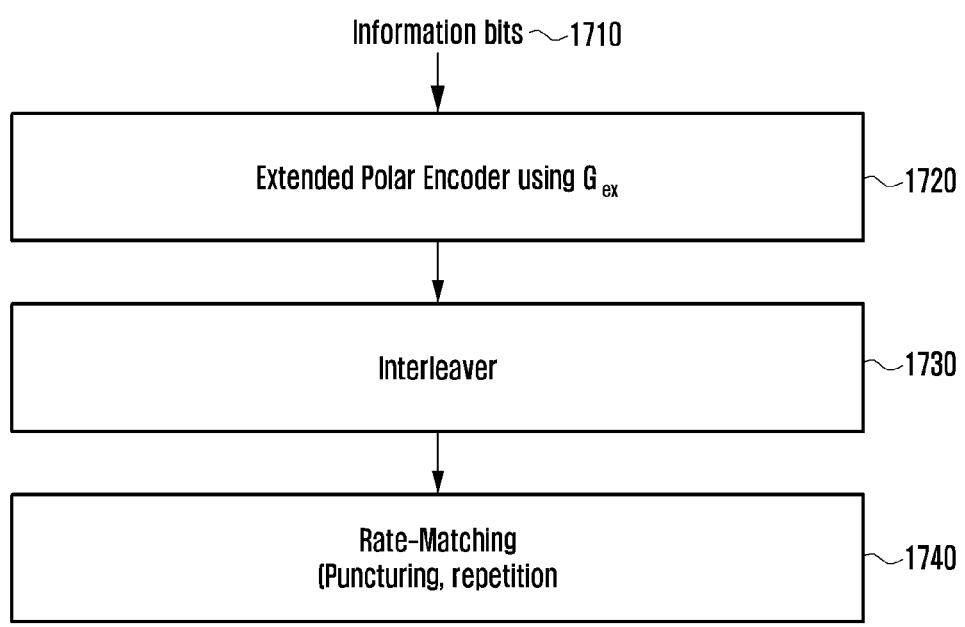
FIG. 17 is a diagram illustrating an encoding method according to a second embodiment of the disclosure.

FIG. 17 is a diagram illustrating an encoding method according to a second embodiment of the disclosure.

With reference to FIG. 17, a transmitter may perform encoding using a generator matrix for encoding. More specifically, the transmitter may perform encoding using a generator matrix $G_{ex}$ defined for encoding of an extended polar code.

If information bits are input at operation 1710, an extended polar code encoder, at operation 1720, may generate bits using the generator matrix $G_{ex}$ based on the information bits. More specifically, vector x' may be generated to satisfy the following equation using vector u including the input information bits and the generator matrix $G_{ex}$ defined for the extended polar code.

$$x' = uG_{ex}$$

As an example, a newly defined generator matrix may be defined as follows.

In the case of considering a bit-reversal matrix:
$G_{ex} = B_{N_0} F^{\log_2 N_0} E_d P$ In the case where a bit-reversal matrix is not considered:
$G_{ex} = F^{\log_2 N_0} E_d P$ The following matrix is an embodiment of $G_{ex}$.

$$G_{12} = \begin{bmatrix} 1 & 1 & 0 & 0 & 0 & 0 & 0 & 0 & 0 & 0 & 0 & 0 \\ 1 & 1 & 0 & 0 & 0 & 0 & 1 & 1 & 0 & 0 & 0 & 0 \\ 1 & 1 & 0 & 1 & 1 & 0 & 0 & 0 & 0 & 0 & 0 & 0 \\ 1 & 1 & 0 & 1 & 1 & 0 & 1 & 1 & 0 & 1 & 1 & 0 \\ 0 & 1 & 1 & 0 & 0 & 0 & 0 & 0 & 0 & 0 & 0 & 0 \\ 0 & 1 & 1 & 0 & 0 & 0 & 1 & 1 & 0 & 0 & 0 & 0 \\ 0 & 1 & 1 & 0 & 1 & 1 & 0 & 0 & 0 & 0 & 0 & 0 \\ 0 & 1 & 1 & 0 & 1 & 1 & 0 & 1 & 1 & 0 & 1 & 1 \end{bmatrix}$$

In the above matrix, 8 columns correspond to a generator matrix of the existing polar code of $N_0 = 8$, and the 4 remaining columns are determined by linear combination of the 8 existing columns. Here, the order of columns may differ depending on a permutation matrix P. In an embodiment, the order of columns is changed by an operation through the generator matrix, but it may be changed in the interleaving process. Further, the generator matrix may be differently determined in accordance with the selected bits.

At operation 1730, interleaving may be performed with respect to the bits obtained through operation 1720.

At operation 1740, rate-matching may be performed with respect to the interleaved information to select and transmit the bits to be used for transmission. In an embodiment, the rate-matching may include a puncturing method and a repetition method.

Figure 18:
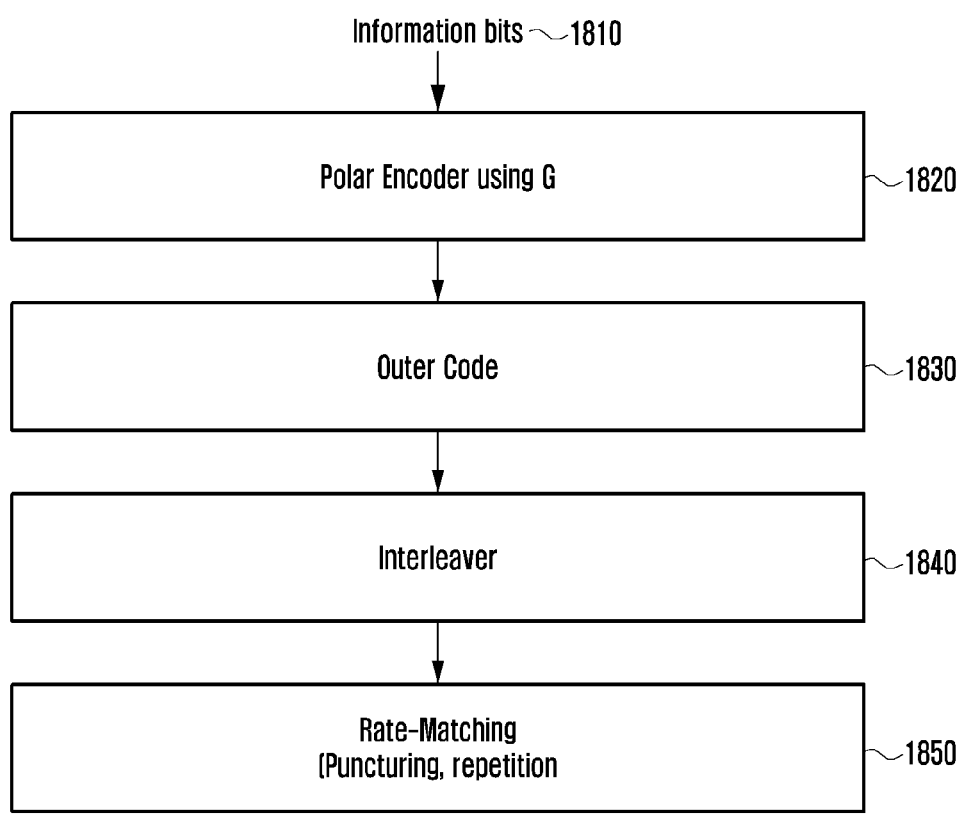
FIG. 18 is a diagram illustrating an encoding method according to a third embodiment of the disclosure.

FIG. 18 is a diagram illustrating an encoding method according to a third embodiment of the disclosure.

With reference to FIG. 18, a transmitter may perform encoding using an outer code. More specifically, the transmitter may perform encoding of an extended polar code through the outer code after the polar code encoding process.

If information bits are input at operation 1810, an extended polar code encoder, at operation 1830, may perform encoding of the extended polar code through the outer code after the encoding process using the polar code at operation 1820. More specifically, a generator matrix of the extended polar code as described above is as follows.

In the case of considering a bit-reversal matrix:
$G_{ex} = B_{N_0} F^{\log_2 N_0} E_d P$ In the case where a bit-reversal matrix is not considered:
$G_e = F^{\log_2 N_0} E_d P$ First, vector x is obtained by performing the following encoding with a generator matrix G of a general polar code.

$$x = uG$$

Vector x' that is the result of the extended polar code encoding is obtained by performing the following outer coding with respect to the obtained vector x.

$$x' = xE_dP$$

Based on this, a codeword may be generated by performing the outer coding.

At operation 1840, interleaving may be performed with respect to the bits obtained through operation 1830.

At operation 1850, rate-matching may be performed with respect to the interleaved information to select and transmit the bits to be used for transmission. In an embodiment, the rate-matching may include a puncturing method and a repetition method.

It is not necessary for the outer coding to be implemented in the form of matrix-multiplication, and any method to obtain the same results may be implemented.

Figure 19:
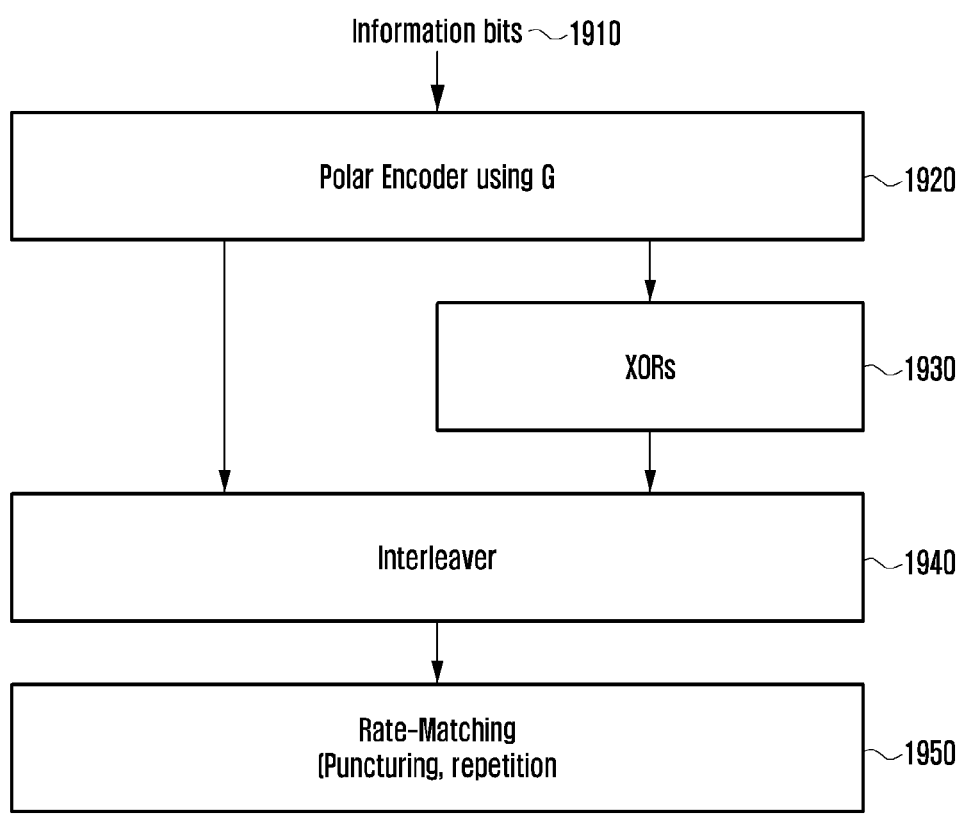
FIG. 19 is a diagram illustrating an encoding method according to a fourth embodiment of the disclosure.

FIG. 19 is a diagram illustrating an encoding method according to a fourth embodiment of the disclosure.

With reference to FIG. 19, another embodiment for performing outer coding is disclosed, and in this case, XOR-based outer coding may be possible.

If information bits are input at operation 1910, an extended polar code encoder, at operation 1920, may perform encoding using a polar code.

At operation 1930, a final codeword may be generated by performing an XOR-operation with respect to partial bits having performed the polar code. In an embodiment, the bits for the XOR-operation may be freely selected.

At operation 1940, interleaving may be performed with respect to the bits obtained through operation 1930.

At operation 1950, rate-matching may be performed with respect to the interleaved information to select and transmit the bits to be used for transmission. In an embodiment, the rate-matching may include a puncturing method and a repetition method.

Figure 20:
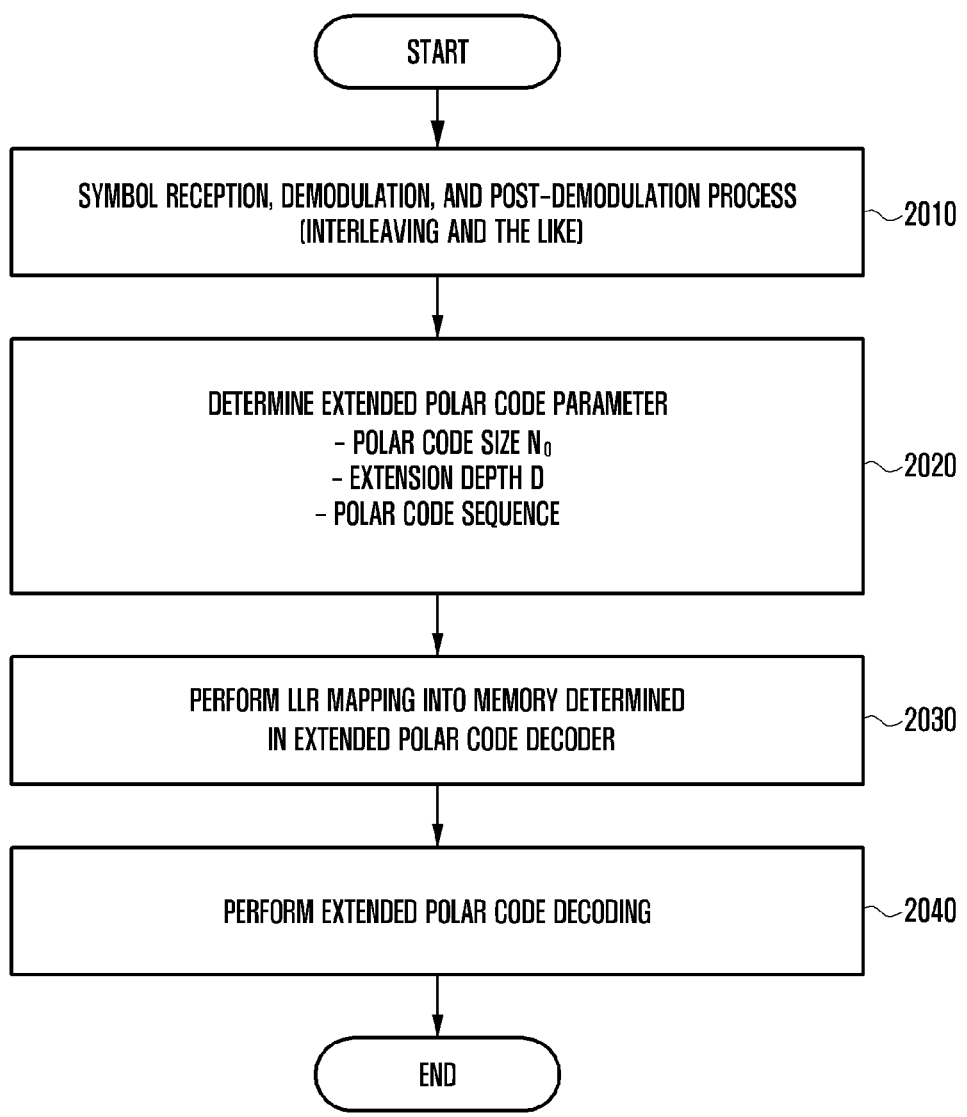
FIG. 20 is a diagram illustrating an operation of a receiver including a decoding process according to the disclosure.

FIG. 20 is a diagram illustrating an operation of a receiver including a decoding process according to the disclosure.

With reference to FIG. 20, a method by a receiver for performing decoding with respect to symbols to which an extended polar code is applied is disclosed.

At operation 2010, a receiver may receive symbols transmitted from a transmitter, and it may perform demodulation and post-demodulation processes (interleaving and the like). Further, the receiver may demodulate the received symbols to generate a log-likelihood ratio (LLR) of respective codeword bits. A predetermined post-demodulation process (interleaving and the like) may be performed with respect to the calculated LLR.

At operation 2020, the receiver may determine a parameter (code size $N_0$, extended depth d, and polar code sequence) of an extended polar code to be used. In an embodiment, a part or the whole of the extended polar code parameter may be pre-engaged between the transmitter and the receiver, or it may be determined in accordance with a determined rule based on the bit length of the received codeword. Further, in accordance with embodiments, the transmitter may transmit information related to the parameter that is necessary for decoding. More specifically, the whole or a part of the parameter used in an embodiment may be pre-engaged between the transmitter and the receiver, or it may be determined by a determined rule (the same rule as that performed in the transmitter) in accordance with the received symbols or a codeword bit length. The polar code sequence may be stored in a memory, and the corresponding polar code sequence is loaded by other predetermined parameters $N_0$ and d. The polar code sequence may differ in accordance with values of $N_0$ and d, and the decoding process may be performed using the same sequence.

At operation 2030, the receiver may map LLR values into a memory in a decoder. In an embodiment, the decoder may be included in the receiver, and it may be operated by a controller of the receiver.

A channel LLR (or called an intrinsic LLR) obtained through demodulation and post-demodulation processes may be mapped into a decoder memory of the receiver in the order corresponding to the order of codeword bit generation in the encoder of the transmitter. In a general polar code, the channel LLR is mapped into only a memory of a variable node on the side of stage-0, but in an extended polar code, the channel LLR may also be mapped into a stage variable node having d determined extended depth, that is, a variable node memory corresponding to the transmitted additional parity, in addition to stage-0. Accordingly, the receiver may additionally include a memory to store therein the channel LLR of the variable node in the stage that is larger than 1 in addition to stage-0. Further, if partial bits are repeatedly transmitted, the channel LLR obtained with respect to the corresponding bits may be combined to be mapped into a predetermined memory.

At operation 2040, the receiver may decode the extended polar code based on the values mapped into the memory. In an embodiment, decoding of the extended polar code having a length of $N_0$ may be performed in a similar manner to the general polar code decoding process having the same size, and in this case, an operation for an additional parity may be added. In the existing polar code, an f-function operation that is called a check node operation is performed at a single parity-check node, and a g-function operation that is called a variable node operation is performed at a repetition node. However, in the extended polar code, an additional g'-function operation may be performed after the f-function operation is performed with respect to the single parity-check node at which the additional parity has been transmitted. Here, the g'-function operation may be performed corresponding to the g-function operation performed at the repetition node. Hereinafter, the decoding of the extended polar code will be described in more detail.

In accordance with embodiments, the receiver may perform the decoding on the assumption that values of d and $N_0$ are set to specific values, and it may determine whether the decoding has been successfully performed through a CRC check. In such a decoding process using the CRC check, it may be determined whether the decoding has succeeded while the values of d and $N_0$ are being changed and applied.

Figure 21:
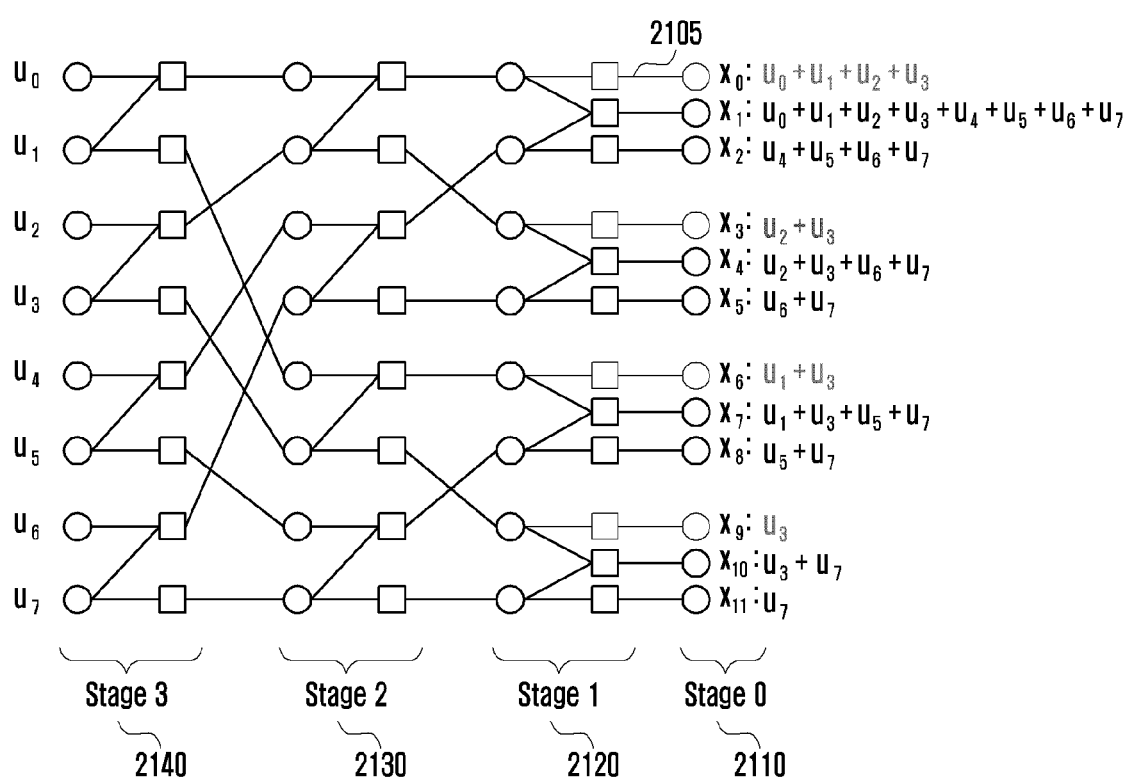
FIG. 21 is a diagram illustrating an encoding process according to an embodiment of the disclosure.

FIG. 21 is a diagram illustrating an encoding process according to an embodiment of the disclosure.

With reference to FIG. 21, an encoding process through extraction of intermediate nodes of an extended polar code P (8, 1) is disclosed.

In an embodiment, in the case of performing encoding by stages on a graph structure, all or parts of values stored in a single parity-check node among calculated values in an intermediate stage in an encoding process indicated by identification number 2105 may be determined as a codeword. Such an encoding process of an extended polar code has complexity and latency corresponding to those of polar code encoding having a size of $N_0$, and it does not require an additional operation and clock cycle. Although a new node is added to express all resultant bits of encoding on the right side of the graph, it is a node that actually performs no operation, and by selecting the values determined in an intermediate calculation process as the codeword, no additional calculation is performed.

In an embodiment, the value of $x_0$ may be related to values of $x_1$ and $x_2$. More specifically, in the case of performing an XOR-operation with respect to the values of $x_1$ and $x_2$, the value of $x_0$ may be derived. In the case of an extended parity bit as described above, it may be configured as a value related to resultant values to which the existing polar code is applied.

Figure 22:
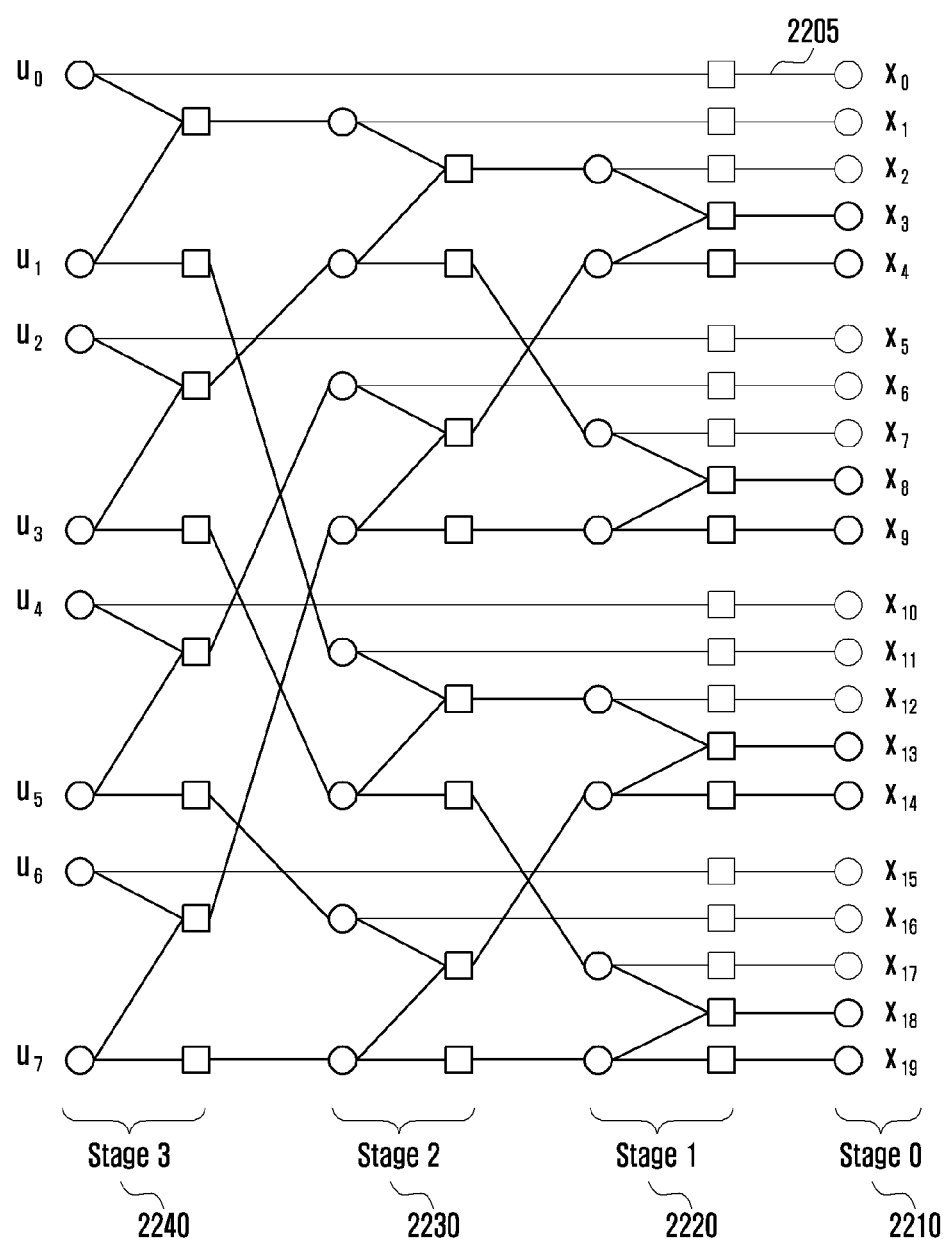
FIG. 22 is a diagram illustrating an encoding process according to another embodiment of the disclosure.

FIG. 22 is a diagram illustrating an encoding process according to another embodiment of the disclosure.

With reference to FIG. 22, an encoding process through extraction of intermediate nodes of an extended polar code P (8, 3) is disclosed.

In an embodiment, if a polar code of $N_0=8$ is extended up to depth 3, a graph of P(8, 3) may be obtained, and values of intermediate nodes are directly added as the encoding results to be selected as a codeword. In this case, all intermediate resultant values may be selected as the codeword, and only partial bits may be selected based on the encoding performance.

In the case where the encoding is efficiently implemented even if the encoding is performed using the newly defined graph structure or the generator matrix as described above, encoding complexity and latency may not be increased in comparison with the general polar code.

Figure 23:
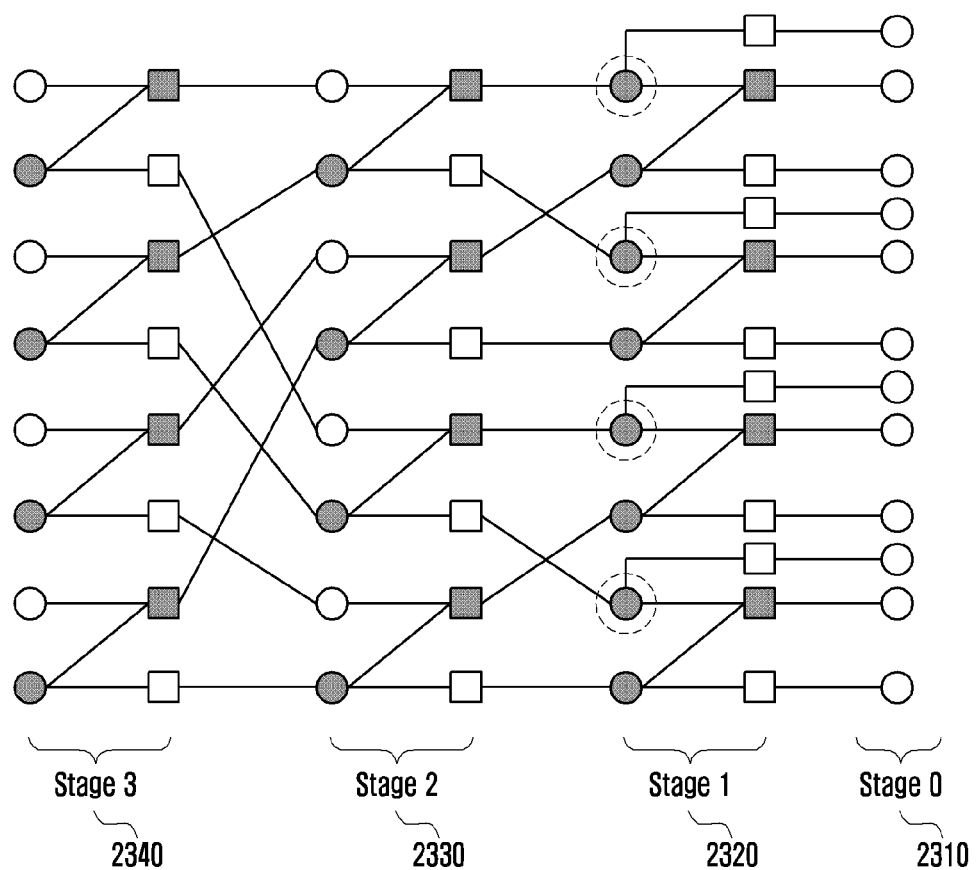
FIG. 23 is a diagram illustrating a decoding process according to an embodiment of the disclosure.

FIG. 23 is a diagram illustrating a decoding process according to an embodiment of the disclosure.

With reference to FIG. 23, a decoding process of an extended polar code is disclosed. In this drawing, it is assumed that additional parities corresponding to four single parity-check nodes of stage-1 2320 have been transmitted. In the graph, occupied figures denote nodes at which operations are performed, and nodes indicated by only lines are bypass nodes that transfer values. Further, portions indicated by outer dotted lines are portions in which additional operations are generated in accordance with decoding of the extended polar code. In this process, as the additional operations, a g'-function operation corresponding to the number of additional parities may be performed, and if the extended depth is d, the number of added clock cycles is generally $2^{d-1}$, but it may be smaller than that in the case where an efficient decoder is implemented.

Even if bits corresponding to partial single parity-check nodes have been transmitted as additional parities and the remaining bits are not transmitted in the same stage, the g'-function operations may be performed at all single parity-check nodes in the stage for a consistent operation of a decoder. In this case, a channel LLR value of a non-transmitted single parity-check node may be fixed to a predetermined value, and more specifically, it may be fixed to 0.

Through the above-described graph, the decoding process of the extended polar code may be performed.

FIG. 24 is a diagram illustrating a decoding scheduling process according to an embodiment of the disclosure.

With reference to FIG. 24, decoding scheduling corresponding to an extended polar code of P (8, 2) is disclosed. Functions applied by stages in accordance with clock cycles and corresponding resultant values are illustrated (2400). First, a resultant value $u_0$ may be acquired by performing f-function operation (clock 1) through selection of one node of which the value is not determined among nodes of stage 1, performing g'-operation corresponding to a parity bit value (clock 2) at a node of stage 1, performing f-function operation (clock 3) at a corresponding node of stage 2, performing g'-operation corresponding to a corresponding parity bit value (clock 4) at a node of stage 2, and then performing f-function operation (clock 5) at a corresponding node of stage 3. Thereafter, resultant values may be acquired by performing f-function operation, g-function operation, and g'-function operation in accordance with the clock cycles.

In an embodiment, the decoding scheduling is a kind of example, and in the case of efficiently configuring hardware for the extended polar code, it may be designed to have the same latency as that of a general polar code.

Figure 25:
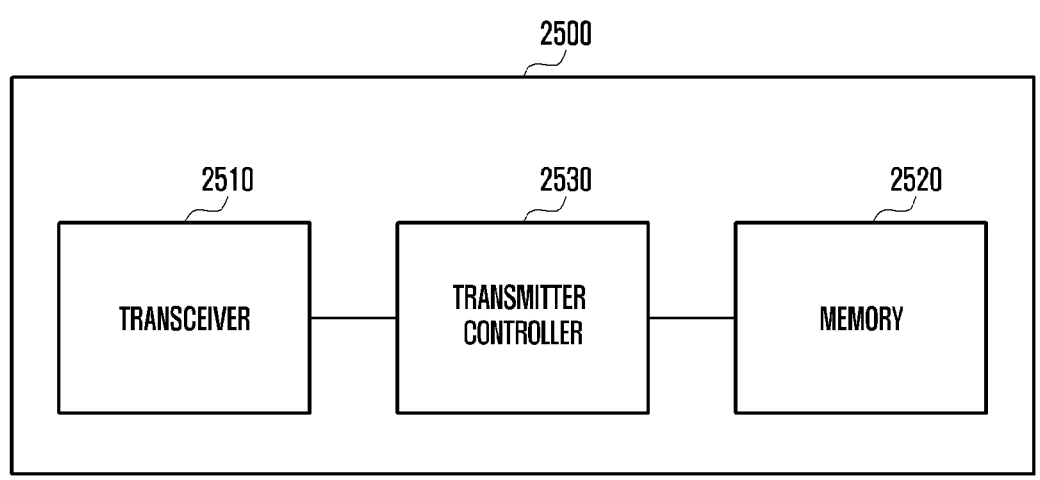
FIG. 25 is a diagram illustrating a transmitter according to the disclosure.

FIG. 25 is a diagram illustrating a transmitter according to the disclosure.

With reference to FIG. 25, a transmitter 2500 according to an embodiment includes a transceiver 2502, a memory 2504, and a controller 2506.

The transceiver 2502 may transmit and receive signals with a receiver.

The memory 2504 may store at least one of information related to the transmitter 2500 and information transmitted and received through the transceiver 2502. The memory 2504 may store sequence information for polar coding.

The controller 2506 may control the operation of the transmitter 2500, and it may control the whole transmitter to perform an operation related to the transmitter as described above in the embodiments. The controller 2506 may include at least one processor.

Figure 26:
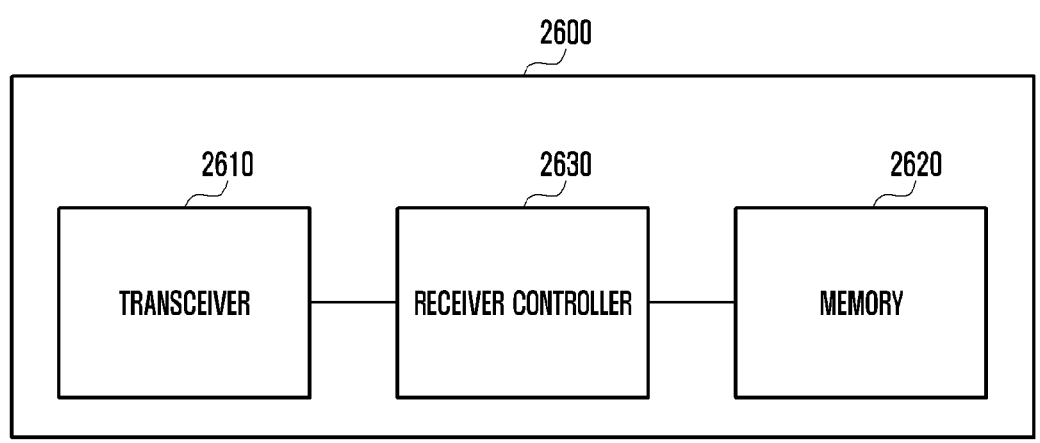
FIG. 26 is a diagram illustrating a receiver according to the disclosure.

FIG. 26 is a diagram illustrating a receiver according to the disclosure.

With reference to FIG. 26, a receiver 2600 according to an embodiment includes a transceiver 2602, a memory 2604, and a controller 2306.

The transceiver 2602 may transmit and receive signals with a receiver.

The memory 2604 may store at least one of information related to the receiver 2600 and information transmitted and received through the transceiver 2602.

The controller 2606 may control the operation of the receiver 2600, and it may control the whole receiver to perform an operation related to the receiver as described above in the embodiments. The controller 2606 may include at least one processor.

The encoding method as described above in the description may be used for not only communication but also broadcasting, memory medium, and memory.

Although preferred embodiments of the disclosure have been described in the specification and drawings and specific wordings have been used, these are merely used as general meanings to assist those of ordinary skill in the art to gain a comprehensive understanding of the disclosure and do not limit the scope of the disclosure. It will be apparent to those of ordinary skill in the art to which the disclosure pertains that various modifications are possible based on the technical concept of the disclosure in addition to the embodiments disclosed herein.

The invention claimed is:

1. A method by a transmitter for transmitting a signal in a communication system, comprising:
    determining a mother code size and depth information for generating a parity bit;
    applying a polar code sequence corresponding to information bits;
    generating, based on the mother code size and the depth information, a codeword including the parity bit associated with at least two of a plurality of bits to which the polar code sequence is applied; and
    transmitting the generated codeword.

2. The method of claim 1, wherein generating the codeword comprises determining at least one of intermediate values as the parity bit in a successive calculation process to obtain resultant values by applying the polar code sequence.

3. The method of claim 1, wherein generating the codeword comprises generating the codeword based on multiplication of a generator matrix determined to include the parity bit associated with the at least two of the plurality of bits, to which the polar code sequence is applied, by the information bits.

4. The method of claim 1, wherein generating the codeword comprises:
generating the codeword by applying an external code determined to generate the parity bit associated with the at least two of the plurality of bits, to which the polar code sequence is applied, to resultant values to which the polar code sequence is applied; and
generating the parity bit through an XOR operation of at least two of the resultant values to which the polar code sequence is applied.

5. A method by a receiver for receiving a signal in a communication system, comprising:
receiving encoded codeword information from a transmitter;
acquiring a mother code size and depth information for generating a parity bit; and
decoding the received codeword based on the mother code size and the depth information,
wherein the generated codeword includes the parity bit associated with at least two of a plurality of bits to which a polar code sequence is applied based on the mother code size and the depth information.

6. The method of claim 5, wherein the parity bit included in the codeword is a bit selected among intermediate values in a successive calculation process to obtain resultant values by applying the polar code sequence, and
the codeword is generated based on multiplication of a generator matrix determined to include the parity bit associated with the at least two of the plurality of bits, to which the polar code sequence is applied, by information bits.

7. The method of claim 5, wherein the codeword is generated by applying an external code determined to generate the parity bit associated with the at least two of the plurality of bits, to which the polar code sequence is applied, to resultant values in which the polar code sequence is applied to information bits, and
the codeword comprises the parity bit generated through an XOR operation of at least two of the resultant values in which the polar code sequence is applied to the information bits.

8. A transmitter of a communication system, comprising:
a transceiver configured to transmit and receive signals; and
a controller configured to control the transceiver, determine a mother code size and depth information for generating a parity bit, apply a polar code sequence corresponding to information bits, generate, based on the mother code size and the depth information, a codeword including the parity bit associated with at least two of a plurality of bits to which the polar code sequence is applied, and transmit the generated codeword.

9. The transmitter of claim 8, wherein the controller is configured to determine at least one of intermediate values as the parity bit in a successive calculation process to obtain resultant values by applying the polar code sequence.

10. The transmitter of claim 8, wherein the controller is configured to generate the codeword based on multiplication of a generator matrix determined to include the parity bit associated with the at least two of the plurality of bits, to which the polar code sequence is applied, by the information bits.

11. The transmitter of claim 8, wherein the controller is configured to:
generate the codeword by applying an external code determined to generate the parity bit associated with the at least two of the plurality of bits, to which the polar code sequence is applied, to resultant values to which the polar code sequence is applied, and
generate the parity bit through an XOR operation of at least two of the resultant values to which the polar code sequence is applied.

12. A receiver of a communication system, comprising:
a transceiver configured to transmit and receive signals; and
a controller configured to control the transceiver, receive encoded codeword information from a transmitter, acquire a mother code size and depth information for generating a parity bit, and decode the received codeword based on the mother code size and the depth information,
wherein the generated codeword includes the parity bit associated with at least two of a plurality of bits to which a polar code sequence is applied based on the mother code size and the depth information.

13. The receiver of claim 12, wherein the parity bit included in the codeword is a bit selected among intermediate values in a successive calculation process to obtain resultant values by applying the polar code sequence.

14. The receiver of claim 12, wherein the codeword is generated based on multiplication of a generator matrix determined to include the parity bit associated with the at least two of the plurality of bits, to which the polar code sequence is applied, by information bits.

15. The receiver of claim 12, wherein the codeword is generated by applying an external code determined to generate the parity bit associated with the at least two of the plurality of bits, to which the polar code sequence is applied, to resultant values in which the polar code sequence is applied to information bits, and
the codeword comprises the parity bit generated through an XOR operation of at least two of the resultant values in which the polar code sequence is applied to the information bits.

* * * * *